United States Patent
Choi et al.

(10) Patent No.: US 9,747,407 B2
(45) Date of Patent: Aug. 29, 2017

(54) CATEGORIZED STITCHING GUIDANCE FOR TRIPLE-PATTERNING TECHNOLOGY

(71) Applicant: Synopsys, Inc., Mountain View, CA (US)

(72) Inventors: Soo Han Choi, Pleasanton, CA (US); Srini Arikati, Mountain View, CA (US); Erdem Cilingir, Sunnyvale, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/678,831

(22) Filed: Apr. 3, 2015

(65) Prior Publication Data

US 2015/0286771 A1    Oct. 8, 2015

Related U.S. Application Data

(60) Provisional application No. 61/975,701, filed on Apr. 4, 2014.

(51) Int. Cl.
| | |
|---|---|
| *G06F 17/00* | (2006.01) |
| *G06F 17/50* | (2006.01) |
| *G03F 7/20* | (2006.01) |

(52) U.S. Cl.
CPC ............ *G06F 17/5081* (2013.01); *G03F 7/70* (2013.01)

(58) Field of Classification Search
USPC ......................................................... 716/51
See application file for complete search history.

(56) References Cited

U.S. PATENT DOCUMENTS

| | | | |
|---|---|---|---|
| 6,408,428 | B1 | 6/2002 | Schlansker et al. |
| 6,421,809 | B1 | 7/2002 | Wuytack et al. |
| 6,704,921 | B2 | 3/2004 | Liu |
| 6,829,216 | B1 | 12/2004 | Nakata |
| 7,049,589 | B2 | 5/2006 | Yamaguchi et al. |
| 7,114,141 | B1 | 9/2006 | Teig et al. |
| 7,560,201 | B2 | 7/2009 | Liu |
| 7,647,212 | B2 | 1/2010 | Andreoli et al. |

(Continued)

FOREIGN PATENT DOCUMENTS

| | | |
|---|---|---|
| WO | WO 2014/130783 A1 | 8/2014 |
| WO | WO 2015/023856 A1 | 2/2015 |

OTHER PUBLICATIONS

U.S. Appl. No. 61/768,365, filed Feb. 22, 2013, Expired.

(Continued)

*Primary Examiner* — Mohammed Alam
(74) *Attorney, Agent, or Firm* — Alston & Bird LLP

(57) ABSTRACT

A computer-implemented method for validating a design is disclosed. The method includes receiving, with the computer, the design, where the design is printable using a multiple-patterning process when the computer is invoked, and where the design includes a plurality of shapes and at least one conflict preventing decomposition of the design into a plurality of multiple-patterning masks. The method also includes forming a subset of the shapes, the subset including the shapes associated with the at least one conflict, categorizing each of the shapes of the subset into one of a plurality of topology types generating one or more stitch candidate solutions for each of the plurality of topology types, and decomposing the design into a plurality of masks.

18 Claims, 27 Drawing Sheets

(56) References Cited

U.S. PATENT DOCUMENTS

| | | | |
|---|---|---|---|
| 7,653,892 | B1 | 1/2010 | Gennari et al. |
| 8,069,423 | B2 | 11/2011 | Ghan et al. |
| 8,190,547 | B2 | 5/2012 | Kirovski |
| 8,209,656 | B1 | 6/2012 | Wang et al. |
| 8,312,394 | B2 | 11/2012 | Ban et al. |
| 8,316,329 | B1 | 11/2012 | Rigby et al. |
| 8,327,299 | B1 | 12/2012 | Gennari |
| 8,359,556 | B1 | 1/2013 | Ghaida et al. |
| 8,402,396 | B2 | 3/2013 | Kahng et al. |
| 8,434,043 | B1 | 4/2013 | Hsu et al. |
| 8,448,100 | B1 | 5/2013 | Lin et al. |
| 8,473,873 | B2 | 6/2013 | Hsu et al. |
| 8,484,607 | B1 | 7/2013 | Tang et al. |
| 8,515,724 | B2 | 8/2013 | Joshi et al. |
| 8,516,403 | B2 | 8/2013 | Abou Ghaida et al. |
| 8,661,371 | B1 | 2/2014 | Wang |
| 8,677,297 | B2 | 3/2014 | Chase et al. |
| 9,298,084 | B2 | 3/2016 | Luo |
| 9,384,319 | B2 | 7/2016 | Cilingir et al. |
| 2009/0070550 | A1 | 3/2009 | Solomon |
| 2010/0050146 | A1 | 2/2010 | Frankle et al. |
| 2010/0064269 | A1 | 3/2010 | Lai et al. |
| 2011/0014786 | A1 | 1/2011 | Sezginer et al. |
| 2011/0052088 | A1 | 3/2011 | Yuan et al. |
| 2011/0197168 | A1 | 8/2011 | Chen et al. |
| 2011/0284996 | A1 | 11/2011 | Kurusu et al. |
| 2013/0007674 | A1* | 1/2013 | Abou Ghaida ..... G06F 17/5081 716/52 |
| 2013/0036397 | A1 | 2/2013 | Lee et al. |
| 2013/0061183 | A1 | 3/2013 | Abou Ghaida et al. |
| 2013/0061185 | A1* | 3/2013 | Abou Ghaida ........... G03F 1/70 716/55 |
| 2013/0074018 | A1* | 3/2013 | Hsu ........................... G03F 1/70 716/55 |
| 2013/0174106 | A1* | 7/2013 | Hsu ......................... G06F 17/50 716/55 |
| 2014/0007026 | A1 | 1/2014 | Chen et al. |
| 2014/0053118 | A1* | 2/2014 | Chen ....................... G06F 17/50 716/52 |
| 2014/0189611 | A1* | 7/2014 | Lai .......................... G06F 17/50 716/52 |
| 2014/0244215 | A1 | 8/2014 | Nakayama et al. |
| 2014/0245237 | A1 | 8/2014 | Cilingir et al. |
| 2014/0282293 | A1 | 9/2014 | Lin et al. |
| 2014/0372958 | A1 | 12/2014 | Lin et al. |
| 2015/0040077 | A1 | 2/2015 | Ho et al. |
| 2015/0234974 | A1 | 8/2015 | Dechene et al. |
| 2017/0004251 | A1 | 1/2017 | Cilingir et al. |
| 2017/0124242 | A1 | 5/2017 | Sharma et al. |
| 2017/0147740 | A1 | 5/2017 | Chang |

OTHER PUBLICATIONS

U.S. Appl. No. 61/866,516, filed Aug. 15, 2013, Expired.
U.S. Appl. No. 14/185,717, filed Feb. 20, 2014, 2014-0245237, Pending.
Application No. PCT/US2014/017619, dated Feb. 21, 2014, WO 2014/130783, Expired.
U.S. Appl. No. 61/975,701, filed Apr. 4, 2014, Expired.
U.S. Appl. No. 14/459,657, filed Aug. 14, 2014, U.S. Pat. No. 9,384,319, Issued.
PCT/US2014/051086, dated Aug. 14, 2014, WO 2015/023856, Expired.
U.S. Appl. No. 14/929,113, filed Oct. 30, 2015, Pending.
U.S. Appl. No. 62/260,227, filed Nov. 25, 2015 Expired.
U.S. Appl. No. 14/996,796, filed Jan. 15, 2016, Pending.
U.S. Appl. No. 15/179,890, filed Jun. 10, 2016, 2017-0004251 Pending.
U.S. Appl. No. 15/359,579, filed Nov. 22, 2016, Pending.

Knuth "Dancing Links," arxiv.org, Cornell University Library, arXiv:cs/0011047 [cs.DS], 26 pages, (2000).
EPO Application No. 16200435.2 (Published as EP3193271), European Search Report and European Search Opinion dated Jun. 21, 2017.
U.S. Appl. No. 14/929,113, Non-Final Office Action dated Jun. 2, 2017.
Beigel et al., "3-Coloring in Time 0(1.3289)," Journal of Algorithms, 54:168-204, (2005).
Dorigo et al., "An Introduction to Ant Colony Optimization," Universite Libre de Bruxelles Institut de Recherches Interdisciplinaires et de Developpements en Intelligence Artificielle (IRIDIA) Technical Report No. TR/IRIDIA/2006-010, 22 pages, (2006).
Fang et al., "A novel layout decomposition algorithm for triple patterning lithography,"in IEEE Trans. on Computer-Aided Design of Integrated Circuit s and Systems (TCAD), 33(3),:397-408, (2014).
Fister et al., "Using differential evolution for the graph coloring," Differential Evolution (SDE), IEEE, Symposium on Apr. 11, 2011, pp. 1-7, doi: 10.1109/SDE.2011.5952075, (2011).
Galinier et al.; "Hybrid Evolutionary Algorithms for Graph Coloring" Journal of Combinatorial Optimization, Kluwer Academic Publishers, pp. 1-33, (1999).
Grosan et al., "Hybrid Evolutionary Algorithms: Methodologies, Architectures, and Reviews," Studies in Computational Intelligence (SCI), 75:1-17, (2007).
Kuang et al., "An Efficient Layout Decomposition Approach for Triple Patterning Lithography," in: Design Automation Conference (DAC) 2013, pp. 1-6, (2013).
Li et al., "14nm M1 Triple Patterning," Proceedings of the International Society for Optics and Photonics (SPIE), 8326:832612-1-832612-7, (2012).
Ian et al., "A polynomial time triple patterning algorithm for cell based row-structure layout," Computer-Aided Design, pp. 57-64, doi: 10.1145/2429384.2429396 (2012).
Yu et al., "Layout Decomposition for Triple Patterning Lithography," 2011 Institute of Electrical and Electronics Engineers/Association for Computing Machinery International Conference on Computer-Aided Design (ICCAD), pp. 1-8, (2011).
EPO Application No. 14753896.1, European Search Report and European Search Opinion mailed Dec. 20, 2016.
Taiwanese Application No. 103105938, First Office Action dated Jun. 5, 2015.
Taiwanese Application No. 103105938, Second Office Action dated Oct. 5, 2015.
U.S. Appl. No. 14/185,717, Final Office Action dated Jan. 13, 2017.
U.S. Appl. No. 14/185,717, Non-Final Office Action dated Apr. 5, 2016.
U.S. Appl. No. 14/459,657, Non-Final Office Action dated Oct. 7, 2015.
U.S. Appl. No. 14/459,657, Notice of Allowance dated Mar. 11, 2016.
U.S. Appl. No. Application No. PCT/US2014/051086, PCT International Search Report dated Nov. 25, 2014.
WIPO Application No. PCT/US2014/051086, PCT Written Opinion of the International Searching Authority dated Nov. 25, 2014.
WIPO Application No. PCT/US2014/051086, PCT International Preliminary Report on Patentability dated Feb. 15, 2016.
WIPO Application No. PCT/US2014/017619, PCT Written Opinion of the International Searching Authority dated May 30, 2014.
WIPO Application No. PCT/US2014/017619, PCT International Search Report dated May 30, 2014.
WIPO Application No. PCT/US2014/017619, PCT International Preliminary Report on Patentability dated Aug. 25, 2015.
U.S. Appl. No. 15/179,890, Non-Final Office Action dated Mar. 13, 2017.

* cited by examiner

CATEGORIZED STITCHING GUIDANCE FOR TRIPLE-PATTERNING TECHNOLOGY

CROSS-REFERENCES TO RELATED APPLICATIONS

This application claims the benefit of U.S. Provisional Application No. 61/975,701 filed Apr. 4, 2014, the content of which is incorporated herein by reference in its entirety.

This application is related to U.S. patent application Ser. No. 14/185,717, filed on Feb. 20, 2014, entitled "HYBRID EVOLUTIONARY ALGORITHM FOR TRIPLE-PATTERNING" by Erdem Cilingir, et al.; U.S. patent application Ser. No. 14/459,657, filed on Aug. 14, 2014, entitled "DETECTING AND DISPLAYING MULTI-PATTERNING FIX GUIDANCE" by Erdem Cilingir, et al., U.S. Pat. No. 8,312,394, entitled "METHOD AND APPARATUS FOR DETERMINING MASK LAYOUTS FOR A SPACER-IS-DIELECTRIC SELF-ALIGNED DOUBLE-PATTERNING PROCESS" by Yonchan BAN, et al., and U.S. Pat. No. 7,560,201, entitled "PATTERNING A SINGLE INTEGRATED CIRCUIT LAYER USING MULTIPLE MASKS AND MULTIPLE MASKING LAYERS" by Tsu-Jae King LIU, the contents of all of which are incorporated herein by reference in their entirety.

FIELD OF THE INVENTION

The present disclosure relates generally to validating integrated circuit design intents using triple or higher multiple-patterning technology, and more particularly to resolving conflicts preventing decomposition of design intents into a multiple-patterning masks.

BACKGROUND

The present invention relates to electronic design automation (EDA), and more particularly, to a method and system for validating and fixing conflicts using stitching in the mask layout of a triple-patterning technology.

Improvements in semiconductor integration densities have largely been achieved through corresponding improvements in semiconductor manufacturing technologies. As semiconductor manufacturing technologies move into the deep submicron era, the semiconductor industry is considering a number of new technologies, such as extreme ultraviolet (EUV) lithography and massively parallel electron beam lithography. Unfortunately, these technologies are not ready for production as yet.

Improvements in process technology can increase integration densities beyond what is achievable in present generation photolithography printing. As an example, double-patterning technology has been used for manufacturing design intents having higher pattern density than those pattern densities limited by what is directly printable by photolithography using a given generation manufacturing process with a single mask pattern. Double-patterning technology uses two different masks to produce higher pattern density in a design intent than is achievable by using just one mask. However, double-patterning technology is not able to handle design intents with more complex and higher pattern density, such as at the 10 nm or smaller technology node, that need to be printed using triple or higher multiple-patterning technology. However, triple or higher multiple-patterning technology poses difficulties with design intent validation.

Accordingly, there is a need to validate design intents using triple or higher multiple-patterning technology.

BRIEF DESCRIPTION OF THE DRAWINGS

The accompanying drawings, which are incorporated in and constitute a part of this specification, illustrate implementations of inventive concepts and, together with the description, serve to explain various advantages and principles of the invention.

SUMMARY OF THE INVENTION

One inventive aspect is a computer-implemented method for validating a design. The method includes receiving, with the computer, the design, where the design is printable using a multiple-patterning process when the computer is invoked, and where the design includes a plurality of shapes and at least one conflict preventing decomposition of the design into a plurality of multiple-patterning masks. The method also includes forming a subset of the shapes, the subset including the shapes associated with the at least one conflict, categorizing each of the shapes of the subset into one of a plurality of topology types generating one or more stitch candidate solutions for each of the plurality of topology types, and decomposing the design into a plurality of masks.

Another inventive aspect is a computer system which when invoked to receive a design, is operative to identify at least one conflict in decomposing the design into at least three masks, and to generate at least one stitch to resolve the at least one conflict. The stitch is generated in accordance with a topology type of one or more shapes associated with the conflict. The computer system is also operative to decompose the design into at least three masks based on the at least one stitch.

Another inventive aspect is a method of providing triple-patterning technology (TPT) coloring guidance to a circuit designer of a design. The method includes identifying a coloring conflict in the design to fix, and forming a stitch in a cut portion of a particular shape related to the conflict without changing the original outline of the particular shape. The method also includes reassigning the cut portion of the particular shape to a different mask than the original particular shape such that the identified coloring conflict is fixed without introducing other coloring conflicts, and decomposing the design into a plurality of masks.

DETAILED DESCRIPTION

Figure 1:
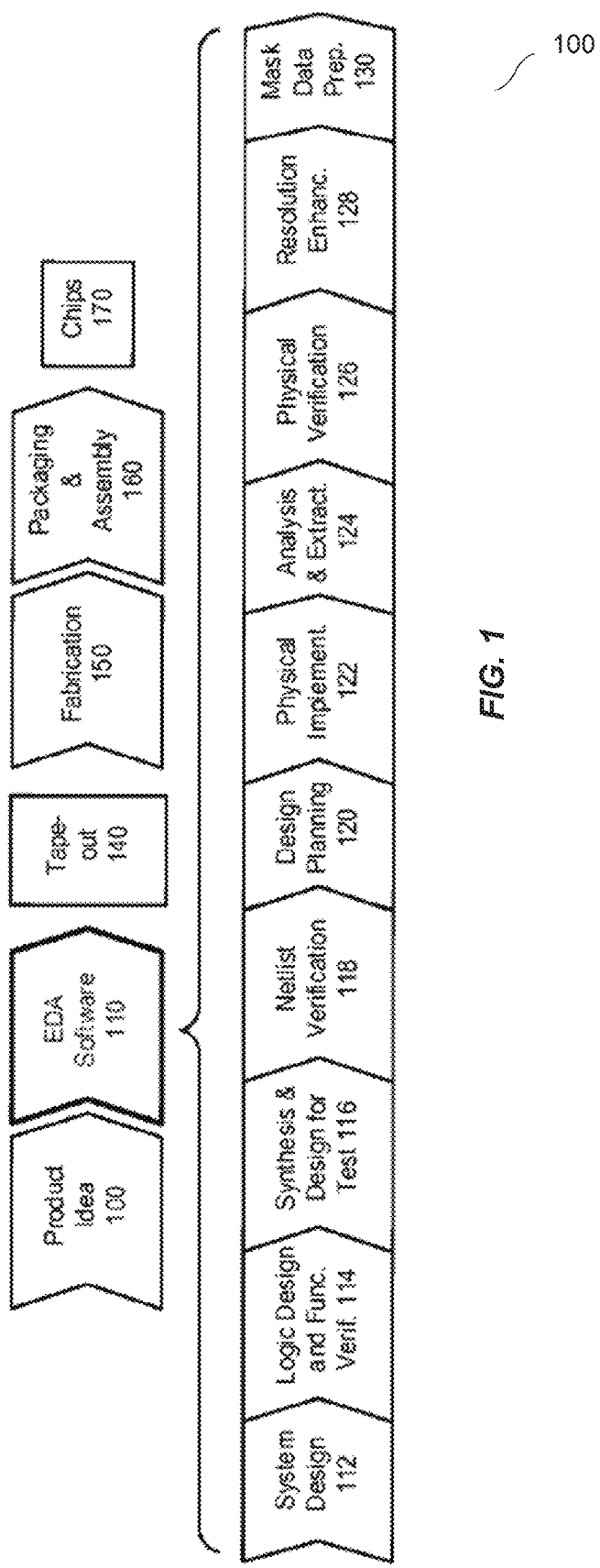
FIG. 1 depicts simplified exemplary steps in the design and fabrication of an integrated circuit.

FIG. 1 depicts simplified exemplary steps in the design and fabrication of an integrated circuit. The process starts with a product idea 100, which is realized using Electronic Design Automation (EDA) software 110. Chips 170 can be produced from the finalized design by performing fabrication 150 and packaging and assembly 160 steps. An exemplary design flow that uses EDA software 110 is described below for illustration purposes only. For example, an actual integrated circuit design may require a designer to perform the design flow steps in a different sequence than the sequence described below.

In the system design 112, a designer describes the functionality to be implemented. The designer can also perform what-if planning to refine the functionality and to check costs. Further, hardware-software architecture partitioning can occur at this step. In the design and functional verification 114, a Hardware Description Language (HDL) design may be created and checked for functional accuracy.

In the synthesis and design 116, the HDL code can be translated to a netlist, which can be optimized for the target technology. Further, tests can be designed and implemented to check the finished chips. In the netlist verification 118, the netlist can be checked for compliance with timing constraints and for correspondence with the HDL code. In the design planning 120, an overall floor plan for the chip can be constructed and analyzed for timing and top-level routing. Next, in the physical implementation 122, placement and routing can be performed.

In the analysis and extraction 124, the circuit functionality can be verified at a transistor level. In the physical verification 126, the design can be checked to correct any functional, manufacturing, electrical, or lithographic issues. In the resolution enhancement 128, geometric manipulations can be performed on the layout to improve manufacturability of the design. Finally, in the mask data preparation 130, the design can be taped-out 140 for production of masks to produce finished chips. The embodiments of the present invention may be used, for example at the steps of either physical verification 126 and/or mask data preparation 130.

In accordance with one embodiment of the present invention, a triple-patterning lithography process is used to print complex design intents with higher pattern density than the pattern density provided by direct photolithographic printing or by double-patterning technology. In some embodiments, the design intent includes two-dimensional patterns that correspond to a circuit design implementing any logic, analog, or analog-digital function. The embodiments of the present invention may be applicable to multiple-patterning lithography technology with higher pattern density than triple-patterning for future process technologies.

Validating design intent for a triple-patterning technology (TPT), in accordance with one embodiment of the present invention, includes determining whether a graph representative of the design intent is three-colorable, e.g. decomposable into three colors or masks. Each vertex in the graph may correspond to a shape in the design intent, and each edge in the graph may correspond to two shapes in the design intent that represent a potential violation of at least one design rule if the two shapes are assigned to the same color/mask, such as the two shapes being separated by a space that is less than a pre-determined distance. The minimum spacing allowed between two shapes may depend on various parameters associated with the shapes. In some embodiments, the minimum allowable spacing between two shapes may be determined based on a set of design rules.

Let k represent the degree of patterning, e.g. k=2 for double patterning and k=3 for triple-patterning or TPT. For double-patterning, determining whether a graph is k-colorable with k=2 may be easily solved by a compact, linear time algorithm to determine patterning errors, hereinafter also referred to as "conflicts". Determining whether a graph is k-colorable, where k>=3, belongs to a class of hard-to-solve computer problems, formally known as Nondeterministic-Polynomial-complete (NP-complete) problems. In other words, there is no known compact mathematical description or characterization of the multiple-patterning conflicts for k>=3. It is unlikely to have a fast algorithm to solve a NP-complete problem optimally, as is known.

Many approximation algorithms have been proposed to solve the k>=3 multiple-coloring problem. For some special cases of design intents, a solution for triple-patterning decomposition uses double-patterning decomposition. Customized evolutionary algorithms are used in a very fast approximate statistical solution for checking graph k-colorability, for k>=3, as described in U.S. Provisional Application No. 61/768,365, filed on Feb. 22, 2013, entitled "Hybrid Evolutionary Algorithm for Triple-Patterning."

Another way to approach the TPT coloring problem is by providing useful guidance for the circuit designer to choose which conflicts to fix by displaying a reduced set of shapes to best solve the conflict as described in U.S. Provisional Application No. 61/866,516, filed on Aug. 15, 2013, entitled "Detecting and Displaying Multi-Patterning Fix Guidance." The conflicts may then be fixed manually or by an automated system to make the modified design layout decomposable. In other words, there is no known compact mathematical description or characterization of the multiple-patterning conflicts for k>=3, without modifying the graph by introducing a technique called stitching, in accordance with embodiments of the present invention.

TPT conflicts were previously solved by changing the layout of the offending shapes, for example, increasing the spacing between two shapes of the same color where the conflict originated. However, such changes in design layout may be complex and may have repercussions involving changes to other nearby shapes. Stitching may eliminate, in many instances, the effect of changes to other nearby shapes when a coloring conflict occurs because the outline of the original shapes may be preserved by assigning a portion of one of the offending shapes to another color. In other words, a stitch may be formed by first cutting a portion of a shape without changing the original outline of the shape, and then reassigning the cut portion of the shape to a different color than the original shape such that the coloring conflict is fixed without introducing other coloring conflicts. The resulting outline of the original shape may be preserved as a combination of the two differently colored shapes overlapping one another over a predetermined or proscribed length in accordance with the design rules where the two shapes are overlapped. However, depending on the circumstances of the design intent and how the stitching is performed, stitching may not always solve coloring conflicts, as will be demonstrated later. Embodiments of the present invention provide a method to ensure stitching solves coloring conflicts.

When the method or a system implementing the method according to embodiments of the present invention, collectively referred to herein as the "system", validates the design successfully, the shapes may be assigned or decomposed into three masks to be used in a TPT. The design intent, however, may not be able to be partitioned into three masks due to the presence of unresolvable conflict edges. A conflict edge is defined as an edge whose end vertices have the same color. In some cases, the system may fail to do the validation successfully, in which case it may output a small number of conflict edges in a first phase of the method. The second phase of the method may use the reduced number of conflict edges from the first phase to graphically display the reduced set of stitch candidate solutions for a designer to choose the desired solution or the system may provide a solution including the minimum number of stitches to fix the coloring conflicts determined in the first phase. At least one stitch may be generated to resolve the conflict in accordance with a condition representative of the conflict. The condition representative of the conflict may be characterized by the graph representing that portion of the design represented in the reduced number of conflict edges from the first phase. Embodiments of the present invention provide a fast validation method that removes coloring conflicts using stitching that minimizes reworking the design intent. Further, the method may improve reliability and reduce complexity for a TPT by reducing the number of stitches required to make the design intent decomposable because increasing the number of stitches may increase the probability for a processing defect.

Figure 2:
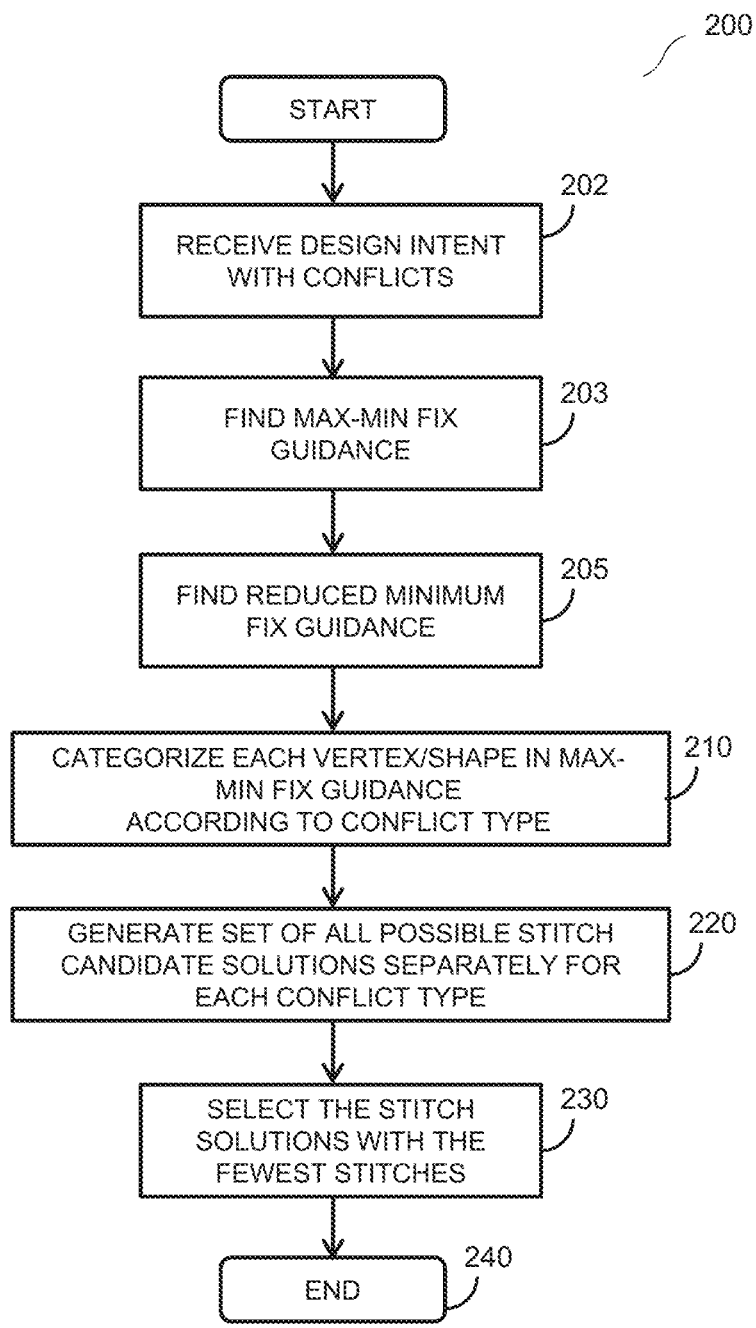
FIG. 2 depicts a simplified flow chart of a technique for validating a design including at least one mask layout conflict of a design intent using TPT.

FIG. 2 depicts a simplified flow chart of a method 200 of validating a design including at least one mask layout conflict of a design intent using TPT, in accordance with one embodiment of the present invention. The various steps of method 200 may be encoded in computer instructions stored in a non-transitory computer memory. A processor of a computer system may execute the instructions in order to cause the computer system to perform the method. After starting, the technique includes receiving 202 the design intent of a multiple-patterning process. The design intent includes a multitude of shapes and at least one mask layout conflict or error. The at least one mask layout conflict causes the coloring of the graph associated with the design intent to be non-decomposable into the specified multitude of masks. In other words the at least one mask layout conflict prevents decomposition of the design intent into the specified multitude of masks of the multiple-patterning process.

Next, at least one guidance to fix the at least one mask layout conflict is output. In one embodiment a multitude of fix guidance types may be output as described below. The resulting fix guidance may be used by the second phase of the method described further below.

Any coloring of a non-decomposable graph includes at least one conflict-edge. In one embodiment, the system finds, or detects and outputs, at least one customized minimum-conflict-edge fix guidance type, hereinafter also referred to as "customized minimum-fix guidance." A customized minimum-fix guidance is an edge that when fixed makes the design decomposable by the multiple-patterning process. The customized minimum-fix guidance is useful because the minimum number of edges may be output to be fixed, thus minimizing the number of edits to the design intent, which is a preferred solution. Customized minimum-fix guidance may be customized as per user specifications, or as per automated specifications or preferences. One such specification may include a preference of minimizing the vertex degrees of the conflict edges, such as the number of edges that are connected to a vertex.

In one embodiment, the system detects and outputs 203, at least one maximum-minimum fix guidance display type. A maximum-minimum fix guidance is an extension of the customized minimum-fix guidance, which indicates most alternative minimum conflict edge configurations. In other words, the maximum-minimum fix guidance outputs edges and shapes proximal to the customized minimum-fix guidance providing the system more flexibility to solve the problem via alternative changes to the design intent other than the customized minimum-fix guidance. Such alternative solutions may be, for practical reasons, easier or simpler to implement than just fixing the customized minimum conflict edge and thus may provide a stitching solution later with fewer stiches. The maximum-minimum fix guidance may be agnostic or independent of the graph structure. The maximum-minimum fix guidance may be saved for later use as described below.

In contrast, another known technique to graphically display a portion of the design intent containing one error is dependent on graph structure and is limited to what is called a conflict cycle. A conflict cycle is a graph with four vertices, where each vertex is connected to all the other three vertices having one error responsible for the graph being non-decomposable. However, the embodiments of the present invention are not limited to the conflict cycle or any other graph structure. Further, embodiments of the present invention output more than one type of fix guidance, including guidance to fix more than one error in a non-decomposable graph.

In one embodiment, the system finds 205, or detects and outputs, at least one reduced-minimum fix guidance display type. The reduced-minimum fix guidance is constructed from the maximal-minimal fix guidance by deleting parts of the maximal-minimal fix guidance that may not be needed by some methods to fix the conflict errors. The design rules of the design intent are used to construct the reduced-minimum fix guidance.

Figure 3A:
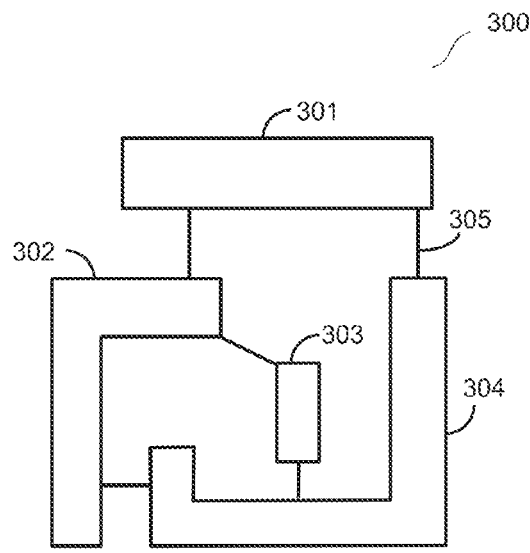
FIGS. 3A-3D depict an example of a design intent, construction of a corresponding graph, three-coloring or decomposing of the graph, and assignment of the design shapes to three masks.
Figure 3B:
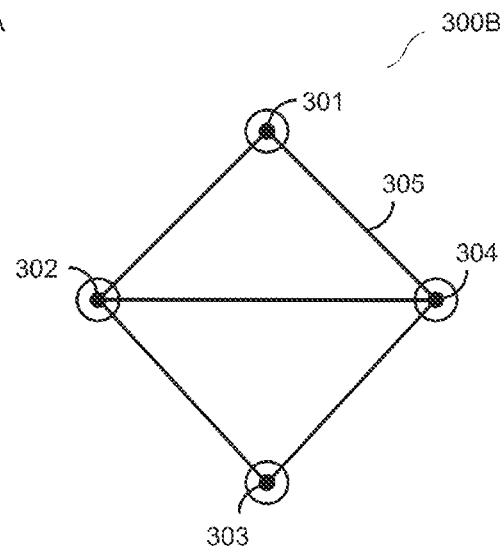
Figure 3C:
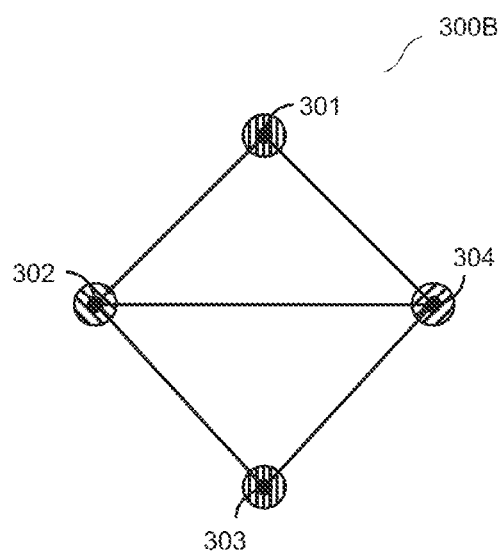
Figure 3D:
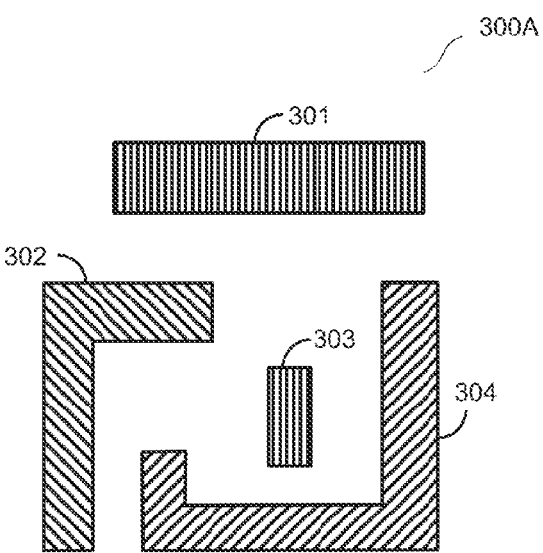

FIGS. 3A-3D depict an example of a design intent, construction of the corresponding graph, three-coloring or decomposing of the graph, and assignment of the design shapes to three masks, respectively. FIG. 3A includes a design intent with 4 shapes 301, 302, 303, and 304. Two shapes such as 301, 304 may be connected by a link 305, depicted by a line, if there is a design rule, e.g. spacing, constraint between them—in other words the two shapes 301, 304 may not be assigned to the same mask. For another example, shapes 301 and 302 may not be assigned to the same mask. FIG. 3B shows the corresponding graph with vertices 301, 302, 303, and 304. During the graph construction, two vertices are connected by an edge 305, depicted by a line, if the corresponding shapes have a spacing constraint between them corresponding to the links in FIG. 3A. Link 305 in design intent 300A may correspond to edge 305 in graph 300B. FIG. 3C shows a three-coloring of the graph, where vertices 301 and 303 are assigned one color, vertex 302 is assigned a second color, and vertex 304 is assigned a third color. FIG. 3D shows the assignment of the design shapes to three masks in which shapes 301 and 303 are assigned to one mask, shape 302 is assigned to a second mask, and shape 304 is assigned to a third mask.

Figure 4A:
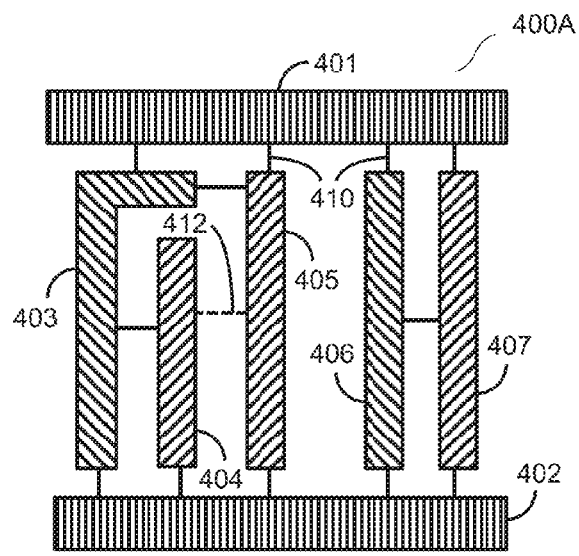
FIGS. 4A-4E depict a simplified design intent displayed as a graph and as a multitude of fix guidance types.

FIGS. 4A-4E depict a simplified design intent 400A displayed as a graph and as a multitude of fix guidance types, in accordance with one embodiment of the present invention. FIG. 4A depicts simplified design intent 400A, in accordance with one embodiment of the present invention. Design intent 400A includes a multitude of shapes of a first color 401, 402, a multitude of shapes of a second color 403, 406, and a multitude of shapes of a third color 404, 405, 407.

Figure 5A:
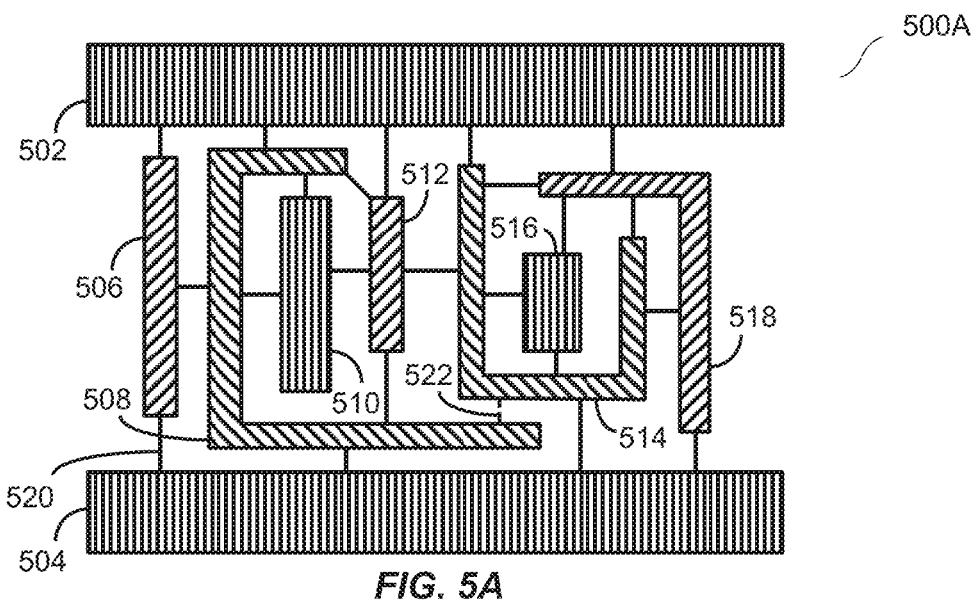
FIGS. 5A-5C depict a simplified design intent graphically displayed as a multitude of fix guidance types.
Figure 5B:
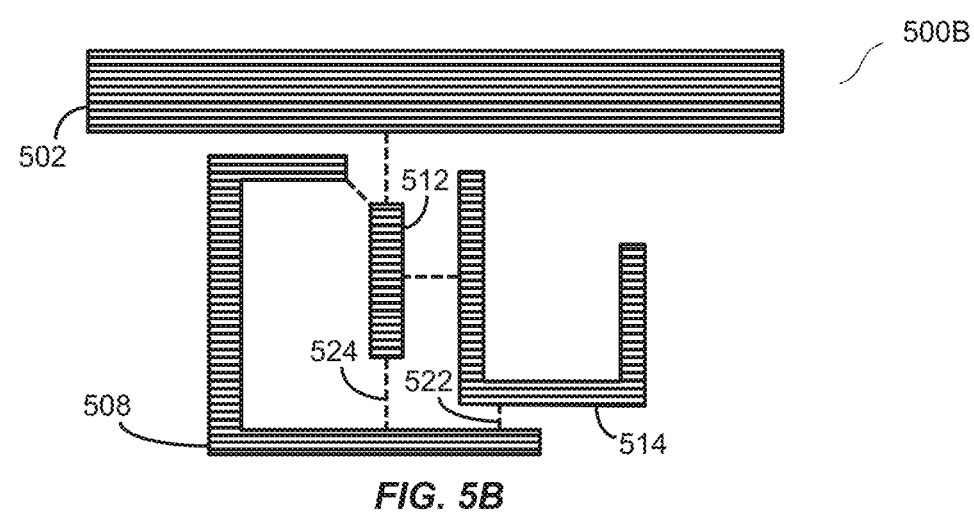
Figure 5C:
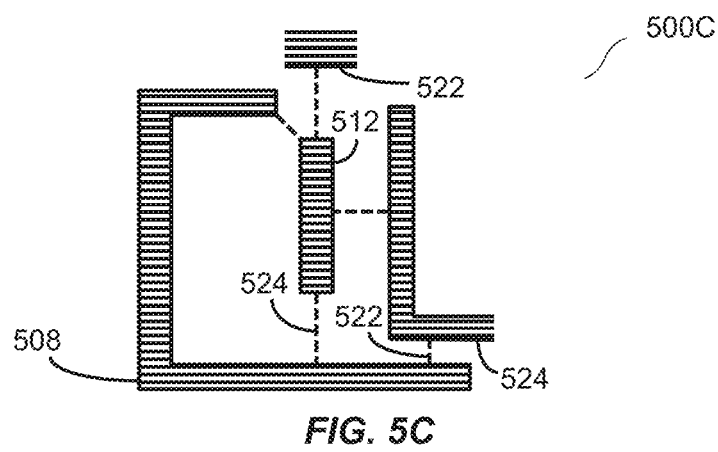

Design intent 400A further includes a multitude of links 410, shown as solid lines, representing design rule constraints between some shapes. A link is distinguishable from an edge in that there may be multiple links associated with one edge because multiple design rule constraints may exist between two shapes, for example, side-to-side and corner-to-corner design rules as depicted in FIG. 5A-5C between shapes 508 and 512 described below. Referring to FIG. 4A, design intent 400A further includes one multi-patterning conflict link 412, shown as a dashed line that is responsible for the non-decomposability of the graph associated with design intent 400A.

Figure 4B:
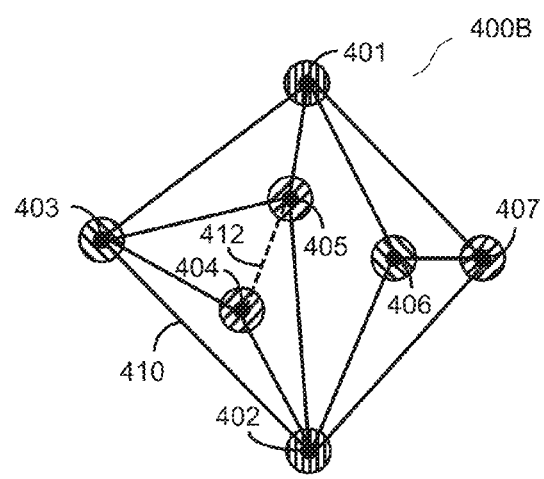

FIG. 4B depicts a simplified graph 400B corresponding to the design intent 400A depicted in FIG. 4A including a minimum conflict edge 412, in accordance with one embodiment of the present invention. Graph 400B includes a multitude of vertices of a first color 401, 402, a multitude of vertices of a second color 403, 406, and a multitude of vertices of a third color 404, 405, 407, where the same reference numbers as used to show the correspondence between a vertex and its associated shape in the design intent. Graph 400B further includes edges 410 depicted as solid lines. Edge 412 depicted as a dotted line corresponds to the customized minimum-fix conflict edge.

Figure 4C:
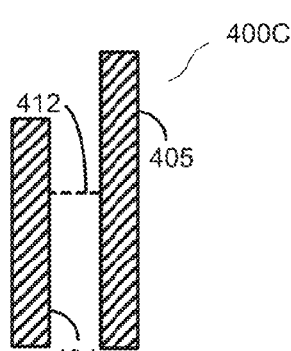

FIG. 4C depicts an exemplary customized minimum-fix guidance output 400C of the design intent 400A depicted in FIG. 4A, in accordance with one embodiment of the present invention. Customized minimum-fix guidance output 400C includes shapes 404 and 405 of the same color and customized minimum conflict link 412.

Figure 4D:
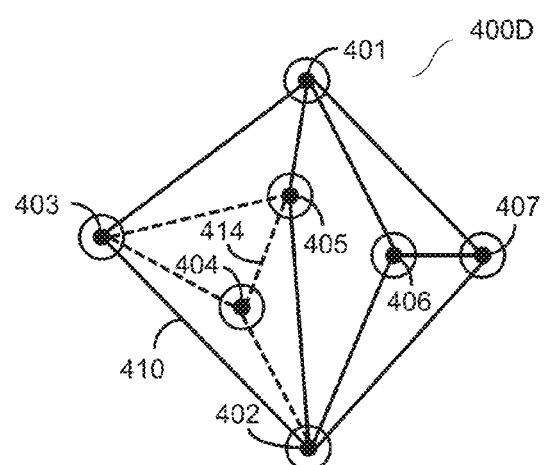

FIG. 4D depicts a simplified graph 400D corresponding to the design intent 400A depicted in FIG. 4A including a multitude of maximum-minimum fix guidance edges 414, in accordance with one embodiment of the present invention. Graph 400D is the same as graph 400B depicted in FIG. 4B except graph 400D includes a multitude of maximum-minimum edges 414 depicted as dashed lines and the vertices are not colored because some of the vertices may be of various potential colorings not yet finally assigned.

Figure 4E:
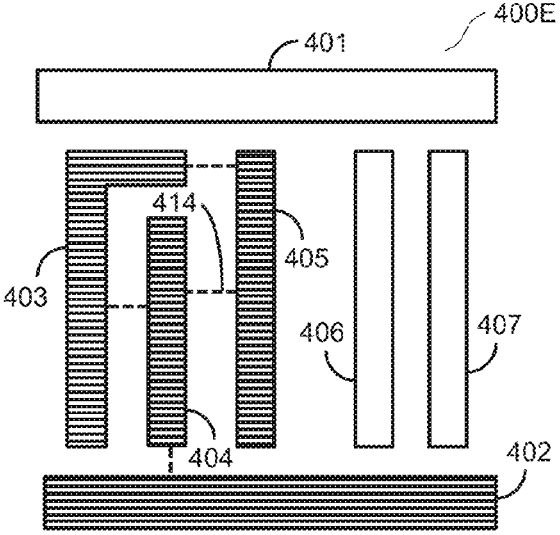

FIG. 4E depicts an exemplary maximum-minimum fix guidance output 400E of the design intent 400A depicted in FIG. 4A, in accordance with one embodiment of the present invention. Maximum-minimum fix guidance output 400E includes shapes 402, 403, 404, 405 as being the shapes to be output, as opposed to shapes 401, 406, 407, which are not part of the maximum-minimum fix guidance. Maximum-minimum fix guidance output 400E further includes maximum-minimum conflict links 414 depicted as dashed lines. Maximum-minimum conflict links 414 include customized minimum-fix conflict link 412 depicted in FIG. 4C. Maximum-minimum fix guidance output 400E has four maximal-minimal conflict links. The user or an automated system may fix any one of these four links to eliminate the triple-patterning error.

FIGS. 5A-5C depict a simplified design intent 500A graphically displayed as a multitude of fix guidance types, in accordance with one embodiment of the present invention. FIG. 5A depicts simplified design intent 500A, in accordance with one embodiment of the present invention. Design intent 500A includes a multitude of shapes of a first color 502, 504, 510, 516, a multitude of shapes of a second color 508, 514, and a multitude of shapes of a third color 506, 512, 518. Design intent 500A further includes a multitude of links 520 shown as solid lines representing design rule constraints between some shapes and one customized minimum conflict link 522, shown as a dashed line that is responsible for the non-decomposability of the graph (not shown) associated with design intent 500A.

FIG. 5B depicts an exemplary maximum-minimum fix guidance output 500B of the design intent 500A depicted in FIG. 5A, in accordance with one embodiment of the present invention. Maximum-minimum fix guidance output 500B includes shapes 502, 508, 512, 514. Maximum-minimum fix guidance output 500B further includes maximum-minimum conflict links 524 depicted as dashed lines. Maximum-minimum conflict links 524 include customized minimum conflict link 522.

FIG. 5C depicts an exemplary reduced-minimum fix guidance output 500C of the design intent 500A depicted in FIG. 5A, in accordance with one embodiment of the present invention. Reduced-minimum fix guidance output 500C includes the same shapes and links as maximum-minimum fix guidance output 500B except that shape 502 may be cut with a shape loop in proximity to the link between shapes 502 and 512 forming cut shape 522 and similarly, shape 514 may be cut with a shape loop in proximity to the link between shapes 508 and 514 forming cut shape 524.

Figure 6:
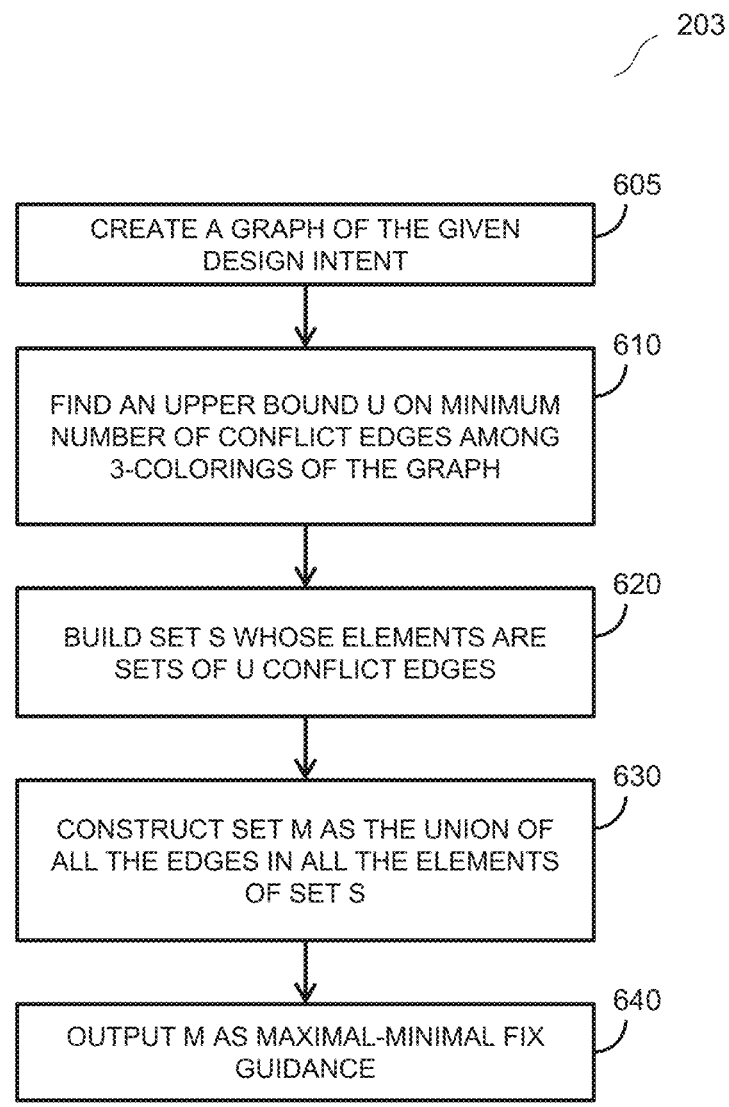
FIG. 6 depicts a simplified flow chart of a technique for detecting and outputting at least one maximum-minimum fix guidance display type depicted in FIG. 2.

FIG. 6 depicts a simplified flow chart of a method 203 of detecting and outputting 203 at least one maximum-minimum fix guidance display type depicted in FIG. 2, in accordance with one embodiment of the present invention.

The various steps of method 203 may be encoded in computer instructions stored in a non-transitory computer memory. A processor of a computer system may execute the instructions in order to cause the computer system to perform the method. A graph is created 605, where the graph vertices represent the shapes of the design intent and the graph edges represent the design condition that the associated shapes cannot be on the same mask in the multi-patterning process due to a constraint such as a design rule. An upper bound U on the minimum number of conflict edges among the three colorings of the graph is found 610. Such an upper bound can be found using exhaustive search if the graph size is small, or it can be calculated using approximation algorithms such as described in U.S. Provisional Application No. 61/768,365, filed Feb. 22, 2013, titled "Hybrid Evolutionary Algorithm for Triple-Patterning." An optimal upper bound is not required. Elements of a set S may be built 620 or calculated by exhaustive enumeration of all combinations of U conflict edges, and then selecting those combinations of U conflict edges whose removal will make the graph 3-colorable or decomposable into 3 colors. Next, set M is constructed 630 as the union of all the edges in all the elements of set S. Set M may contain all alternative minimal sets of conflict edges of the graph. Set M is output 640 as the maximal-minimal fix guidance including all the edges of members of elements of S and the vertices connected to those edges.

Figure 7:
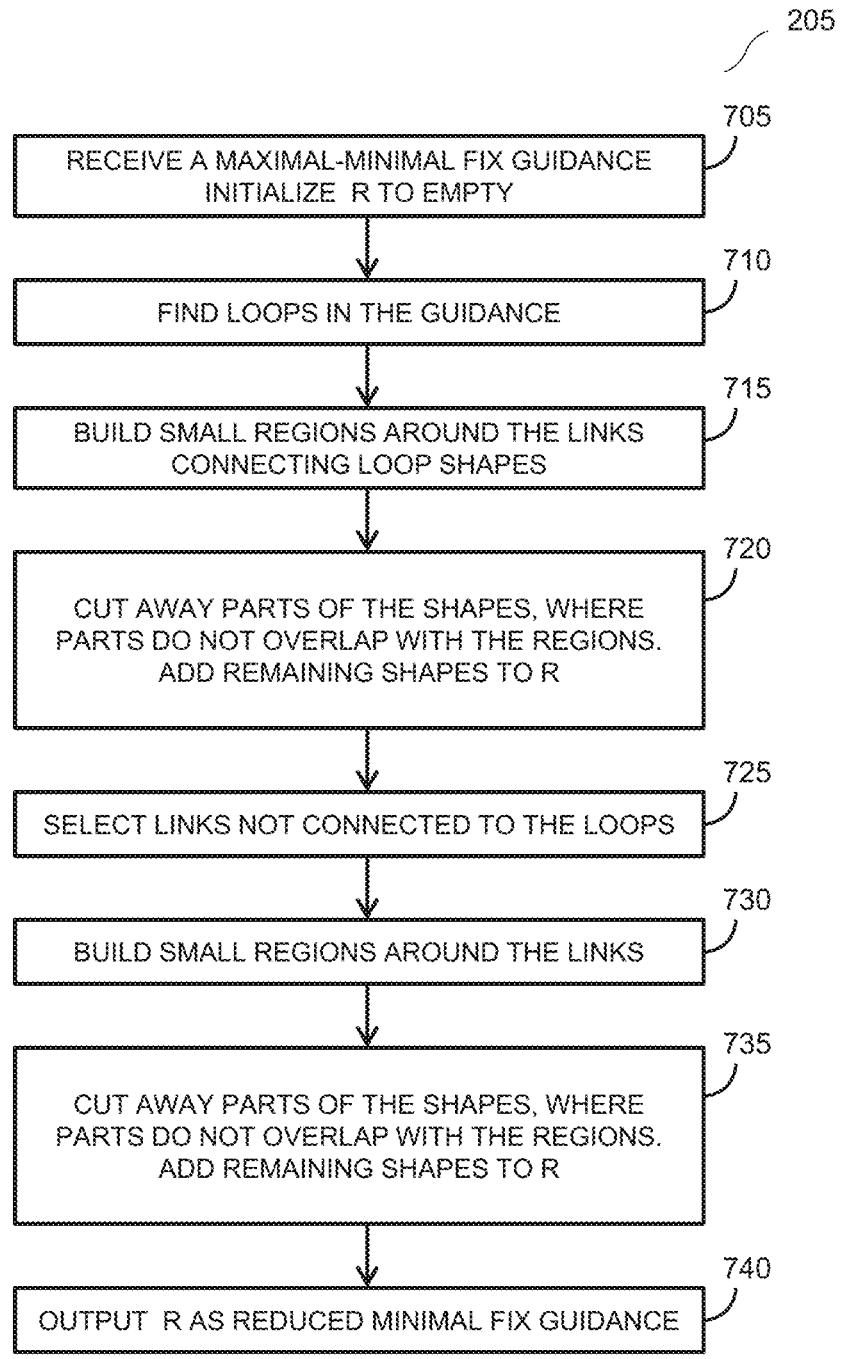
FIG. 7 depicts a simplified flow chart of a technique for finding, or detecting and outputting, at least one reduced-minimum fix guidance display type depicted in FIG. 2.

FIG. 7 depicts a simplified flow chart of a method 205 for finding, for example, detecting and outputting, at least one reduced-minimum fix guidance display type depicted in FIG. 2, in accordance with one embodiment of the present invention. The various steps of method 205 may be encoded in computer instructions stored in a non-transitory computer memory. A processor of a computer system may execute the instructions in order to cause the computer system to perform the method. A maximal-minimum fix guidance may be received 705 as an input, and initializes R to empty. R represents the reduced-minimum fix guidance to be output. Loops in the input maximal-minimum fix guidance are found 710. A loop is a closed connected path, based in part on the shapes and links of the fix guidance. A multitude of small regions are built 715 around the loop links. The size of each of the small regions may be controlled by the design rules of the design intent, such as for example, the minimum space around shapes. Parts of the shapes, which do not overlap with the regions, are cut 720, and the remaining shapes are added to R. Next, links not connected to the loop shapes are selected 725, and small regions around the links are built 730 or constructed. Once again, parts of the shapes, which do not overlap with the small regions, are cut 735, and the remaining shapes are added to R. R is output 740 as the reduced minimum fix guidance.

Referring to FIG. 2 again, after finding 205 the reduced-minimum fix guidance, the flowchart continues to the second phase of the method that provides stitching. Each vertex and hence each corresponding shape in the maximum-minimum fix guidance may be categorized 210 according to a multitude of conflict types.

Figure 8:
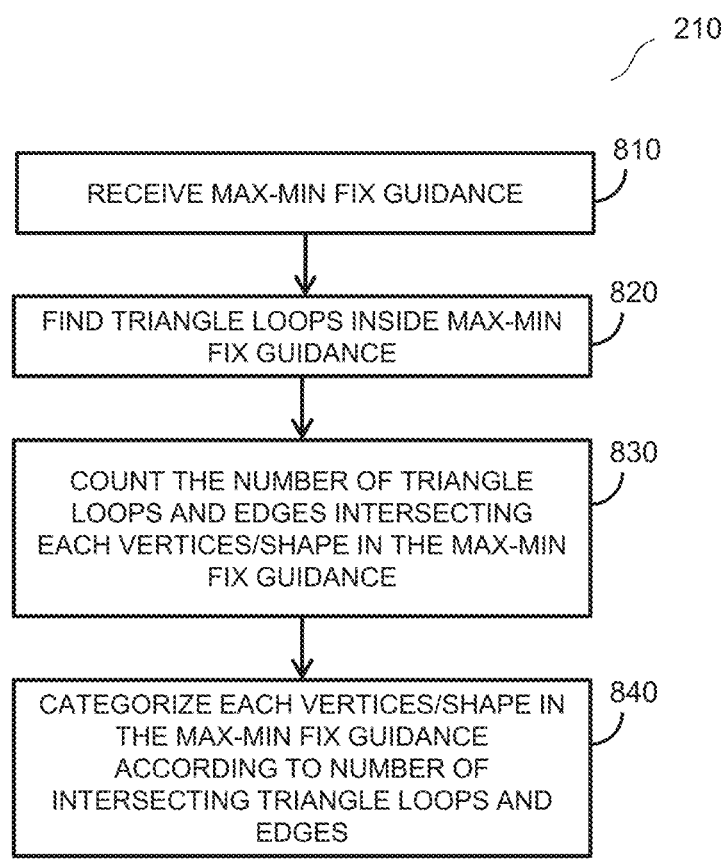
FIG. 8 depicts a simplified flow chart for categorizing vertices in the maximum-minimum fix guidance.

FIG. 8 depicts a simplified flow chart of a method 210 of categorizing vertices in the maximum-minimum fix guidance, in accordance with one embodiment of the present invention. The various steps of method 210 may be encoded in computer instructions stored in a non-transitory computer memory. A processor of a computer system may execute the instructions in order to cause the computer system to perform the method. The maximum-minimum fix guidance may be received 810. In one embodiment, the graph corresponding to the maximum-minimum fix guidance may include one or more triangle loops. A triangle loop may be a set of vertices and edges that form a closed path of three edges in the shape of a triangle—each end of the three edges terminated by one of three vertices. The conflict type for each vertex may be determined on a vertex by vertex basis in accordance with characteristics of the graph corresponding to the maximum-minimum fix guidance, such as triangle loops and edges but not the color of vertices. Accordingly, the method finds 820 the triangle loops inside the maximum-minimum fix guidance. Next, the method counts 830 the number of triangle loops and edges intersecting each vertices/shape in the maximum-minimum fix guidance. The method may then categorize each vertex/shape in the maximum-minimum fix guidance according to the number of triangle loops and edges that intersect each vertex.

FIGS. 9A-9E depict a simplified multitude of exemplary graphs 900A-900E respectively representing different maximum-minimum fix guidance outputs including a multitude of classified vertices 901, 902, 903, 904, in accordance with one embodiment of the present invention. Each graph in the multitude of graphs 900A-900E may include a multitude of vertices, such as for example 901, 902, 903, 904, that may represent a multitude of different corresponding shapes in a corresponding maximum-minimum fix guidance output analogous to the output described above in reference to FIG. 5B. FIGS. 9A-9E further depict that each graph in the multitude of graphs 900A-900E may include a multitude of maximum-minimum conflict edges 924, depicted as dashed lines, each edge 924 corresponding to a different maximum-minimum conflict link analogous to multitude of maximum-minimum conflict links 524 depicted in FIG. 5B-5C.

Each of the graphs 900A-900E may further include at least one customized minimum conflict edge as one of the multitude of maximum-minimum conflict edges 924. Each of the customized minimum conflict edge may be analogous to customized minimum conflict link 522 depicted in FIG. 5B-5C. However, referring to FIGS. 9A-9E, the identity of which one of the maximum-minimum conflict edges 924 in each graph may be the customized minimum conflict edge may be irrelevant for discussing the classification of vertices 901, 902, 903, 904.

In one embodiment, the multitude of classified vertices 901, 902, 903, 904 may be classified into four separate topology types of vertices, type 1, type 2, type 3, type 4 corresponding respectively to vertices 901, 902, 903, 904 and depicted with four different respective fill patterns. It should be emphasized that vertex types should not be confused with vertex colors because categorized vertex types are agnostic with regard to color as explained by the following vertex conflict type definitions used by the categorization step 840 in FIG. 8 above.

Figure 9A:
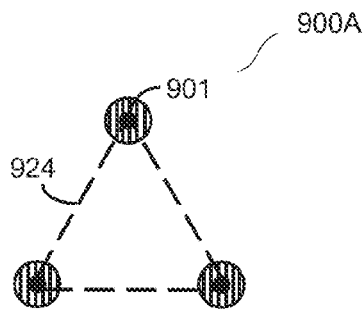
FIGS. 9A-9E depict a simplified multitude of exemplary graphs respectively representing different maximum-minimum fix guidance outputs including a multitude of classified vertices.

FIG. 9A depicts a simplified exemplary graph 900A including type 1 vertices, in accordance with one embodiment of the present invention. Graph 900A includes three type 1 vertices 901, depicted by a vertically oriented fill pattern. Type 1 vertices 901 may be defined as any vertex that terminates two or fewer edges. Graph 900A is also an example of a triangle loop. Each of the vertices 901 in graph 900A terminate two edges and are therefore all type one vertices.

Figure 9B:
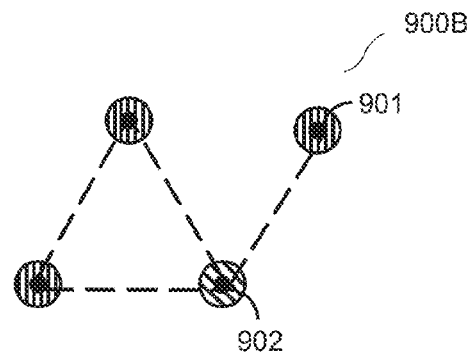

FIG. 9B depicts a simplified exemplary graph 900B including type 1 and type 2 vertices, in accordance with one embodiment of the present invention. Graph 900B includes three type 1 vertices 901, and a type 2 vertex 902, depicted by a first diagonally oriented fill pattern. One of the vertices 901 in graph 900B terminates one edge and is therefore also a type 1 vertex. Type 2 vertices 902 may be defined as any vertex that intersects one triangle loop and at least one other edge not included in the one triangle loop.

Figure 9C:
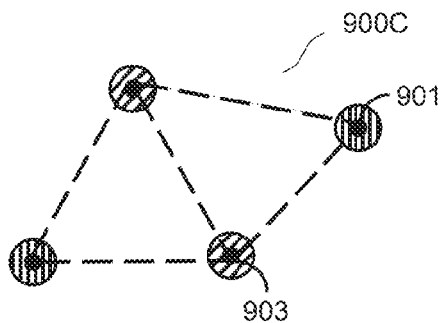

FIG. 9C depicts a simplified exemplary graph 900C including type 1 and type 3 vertices, in accordance with one embodiment of the present invention. Graph 900C includes two type 1 vertices 902 and two type 3 vertices 903, depicted by a second diagonally oriented fill pattern. Type 3 vertices 903 may be defined as any vertex that intersects with two triangle loops excluding any exterior triangle loop if present.

Figure 9D:
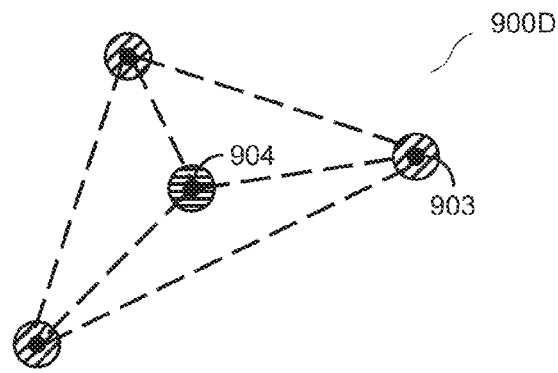

FIG. 9D depicts a first simplified exemplary graph 900D including type 3 and type 4 vertices, in accordance with one embodiment of the present invention. Graph 900D includes three type 3 vertices 903, and a type 4 vertex 904, depicted by a horizontally oriented fill pattern. Graph 900D is a special case of a multitude of triangle loops forming a combined triangle loop at the outer circumference of graph 900D. It should be noted that the triangle loop formed from the outer circumference of graph 900D is an exterior triangle loop and is not counted as a triangle loop by the method. Accordingly, the method counts three triangle loops in graph 900D and not four. Therefore, each of the vertices on the outer circumference of graph 900D is defined as a type 3 vertex because each intersects just two triangle loops and not three. Type 4 vertex 904 may be defined as any vertex that intersects three or more triangle loops. Vertex 904 intersects three triangle loops as so qualifies as a type 4 vertex.

Figure 9E:
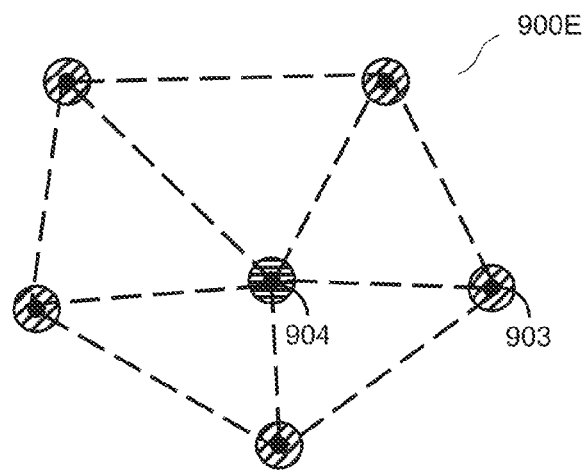

FIG. 9E depicts a second simplified exemplary graph 900E including type 3 and type 4 vertices, in accordance with one embodiment of the present invention. Graph 900E includes five type 3 vertices 903, and one type 4 vertex 904. The method counts five triangle loops in graph 900E. Each of the vertices on the outer circumference of graph 900E is defined as a type 3 vertex because each intersects just two triangle loops and not three. Vertex 904 intersects five triangle loops as so qualifies as a type 4 vertex.

Referring to FIG. 2, after the method categorizes 210 each vertex/shape, the method may then generate 220 a set of possible stitch candidate solutions to resolve the conflict separately for each conflict type in accordance with a condition representative of the conflict. The condition representative of the conflict may be characterized by the graph representing the maximum-minimum fix guidance from the first phase of the method, and the conflict types of the shapes. In one embodiment, one set of stitch candidate solutions is generated by evaluating a single conflict type. In one embodiment, the set of possible stitch candidate solutions may include all the possible stitch candidate solutions. It is understood that the possible stitch candidate solutions are valid solutions that do not break design rules. Then, before ending 240, the method may select 230 the stitch solutions with the fewest stitches—the stitch solutions being from one of the set of possible stitch candidate solutions. In one embodiment, the stitch solutions are from only one of the set of possible stitch candidate solutions.

Figure 10:
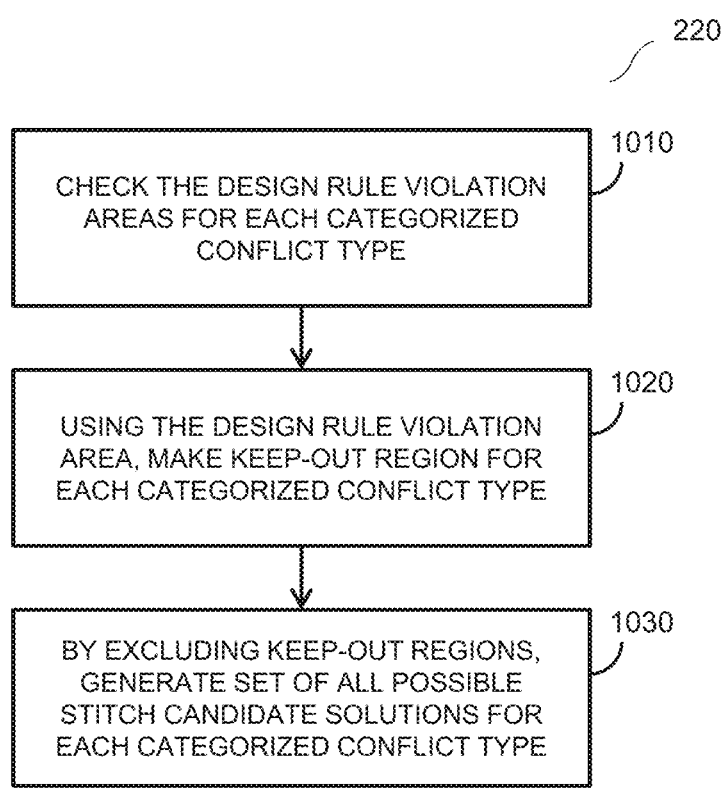
FIG. 10 depicts a simplified flow chart for generating stitch candidates in the maximum-minimum fix guidance as referenced in FIG. 2.
Figure 11A:
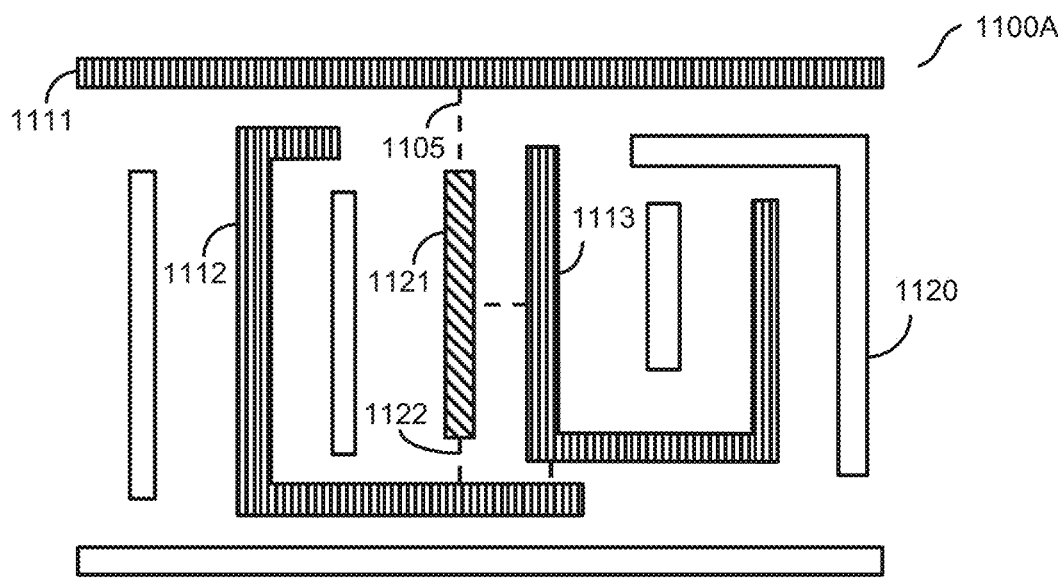
FIGS. 11A-11D depict a simplified exemplary maximum-minimum fix guidance used to generate one or more stitch candidates from vertices/shapes.

FIG. 10 depicts a simplified flow chart of a method 220 of generating stitch candidates in the maximum-minimum fix guidance as referenced in FIG. 2, in accordance with one embodiment of the present invention. The various steps of method 220 may be encoded in computer instructions stored in a non-transitory computer memory. A processor of a computer system may execute the instructions in order to cause the computer system to perform the method. FIG. 11A depicts a simplified exemplary maximum-minimum fix guidance 1100A used to generate one or more stitch candidates from type 1 and type 2 vertices/shapes, in accordance with one embodiment of the present invention. Simplified exemplary maximum-minimum fix guidance 1100A may include multitude of maximum-minimum conflict links 1105, in accordance with one embodiment of the present invention. Multitude of maximum-minimum conflict links 1105 may be determined by the method in analogous way as multitude of maximum-minimum conflict links 524 referenced in FIG. 5B above. Maximum-minimum fix guidance 1100A may further include a multitude of three type 1 shapes 1111, 1112, 1113, at least one type 2 shape 1121, and multitude of shapes 1120 of other types or not part of the maximum-minimum fix guidance 1100 shapes. Maximum-minimum conflict links 1105 may include at least one customized minimum conflict link 1122 analogous to customized minimum conflict link 522 depicted in FIGS. 5A-5C.

Figure 11B:
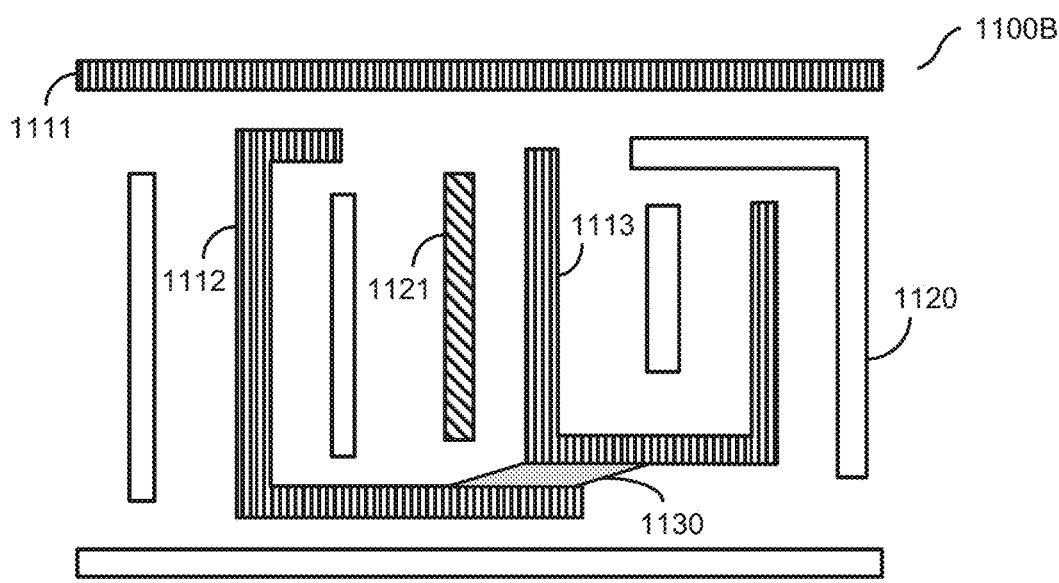
Figure 11C:
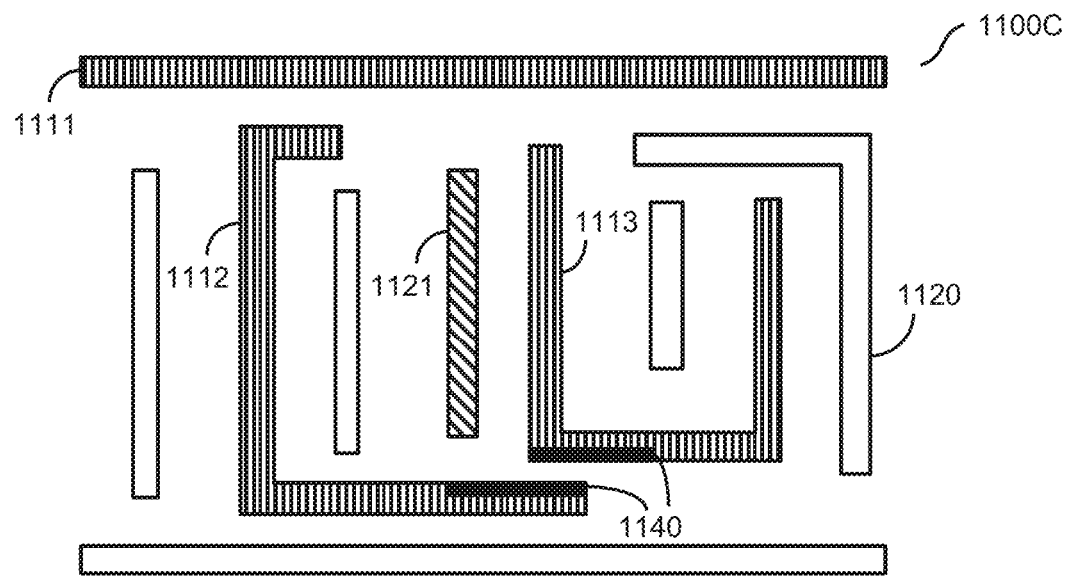
Figure 11D:
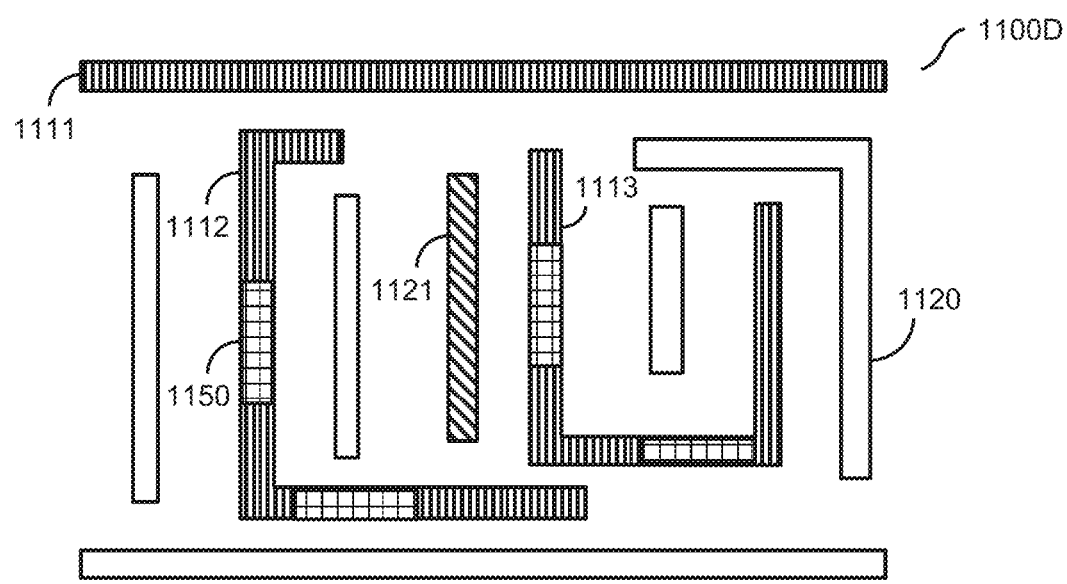

In one embodiment, generating the multitude of stitch candidates may be done by the method one conflict type at a time. FIGS. 11B-11D depict a simplified exemplary maximum-minimum fix guidance 1100 (e.g. 1100B, 1100C, 1100D) used to generate one or more stitch candidates from type 1 vertices/shapes, in accordance with one embodiment of the present invention. FIG. 11B depicts the simplified exemplary maximum-minimum fix guidance 1100B similar to maximum-minimum fix guidance 1100A depicted in FIG. 11A except including design rule violation area 1130 between type 1 shapes 1112, 1113, in accordance with one embodiment of the present invention. In other embodiments, a multitude of design rule violation areas may be generated depending on the configuration of the shapes in the design intent. Referring simultaneously to FIG. 11B and FIG. 10, the method checks 1010 the design rule violation areas for each categorized conflict type generating design rule violation area 1130, such as for example a spacing design rule violation.

FIG. 11C depicts the simplified exemplary maximum-minimum fix guidance 1100C similar to maximum-minimum fix guidance 1100A depicted in FIG. 11A. Maximum-minimum fix guidance 1100C includes a multitude of keep out regions 1140 on type 1 shapes 1112, 1113, in accordance with one embodiment of the present invention. Referring simultaneously to FIGS. 11B-11C and FIG. 10, the method uses design rule violation area 1130 to make keep-out regions for each categorized conflict type, generating the keep-out regions 1140.

FIG. 11D depicts the simplified exemplary maximum-minimum fix guidance 1100D similar to maximum-minimum fix guidance 1100A depicted in FIG. 11A. Maximum-minimum fix guidance 1100D includes a set of one or more possible stitch candidate solutions 1150 for type 1 shapes 1112, 1113, in accordance with one embodiment of the present invention. Referring simultaneously to FIGS. 11C-11D and FIG. 10, the method, by excluding multitude of keep-out regions 1140, generates a set or multitude of possible stitch candidate solutions for each categorized conflict type, such that a multitude of possible stitch candidate solutions 1150 are generated.

Figure 12A:
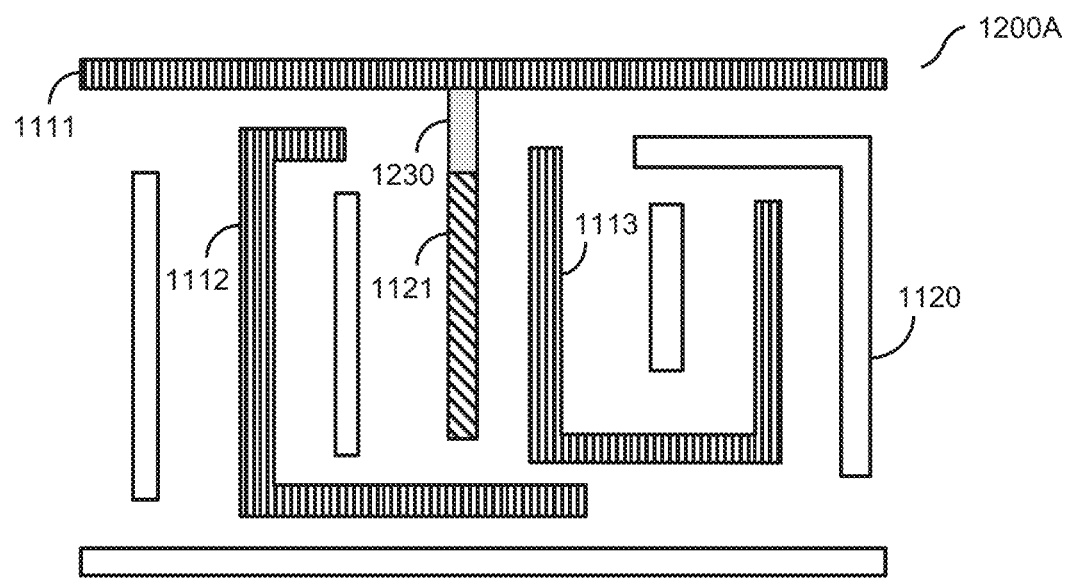
FIGS. 12A-12C depict a simplified exemplary maximum-minimum fix guidance used to generate one or more stitch candidates from vertices/shapes.
Figure 12B:
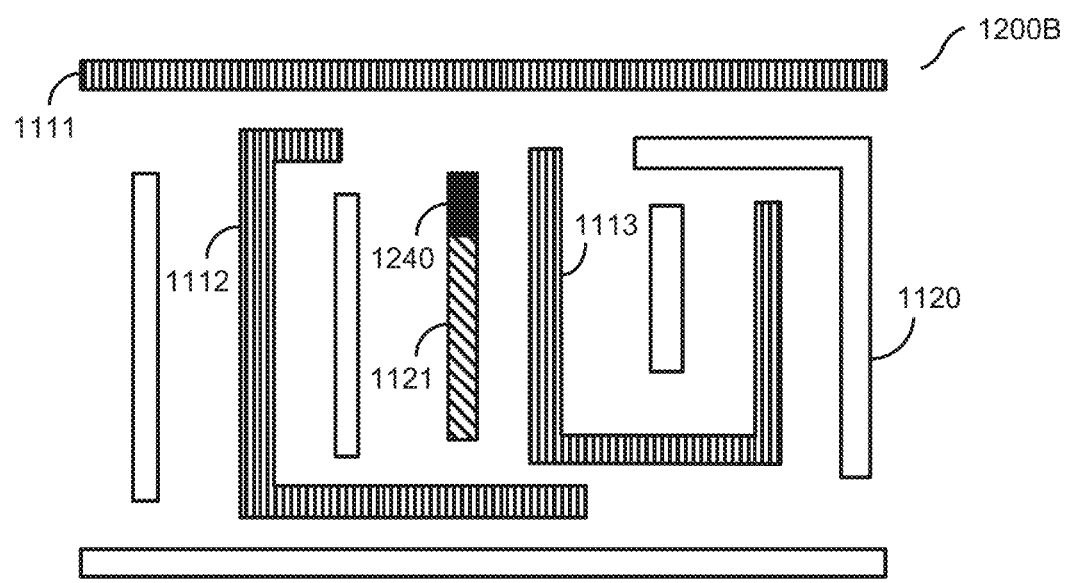
Figure 12C:
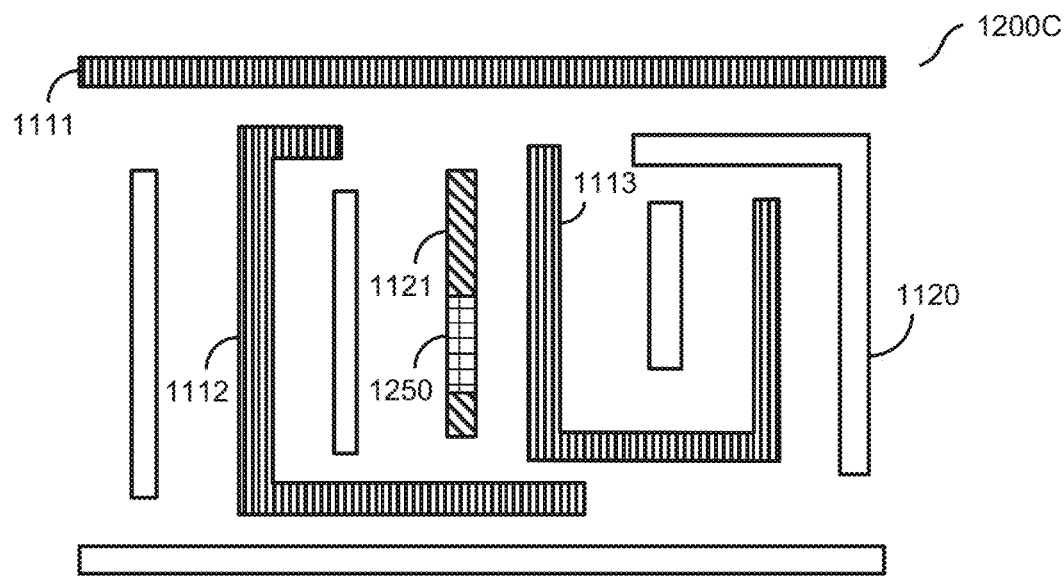

FIGS. 12A-12C depict a simplified exemplary maximum-minimum fix guidance 1200 (e.g. 1200A, 1200B, 1200C) used to generate a multitude of stitch candidates from type 2 vertices/shapes, in accordance with one embodiment of the present invention. FIG. 12A depicts the simplified exemplary maximum-minimum fix guidance 1200A similar to maximum-minimum fix guidance 1100B depicted in FIG. 11B. maximum-minimum fix guidance 1200A includes a design rule violation area 1230 between type 1 shape 1111 and type 2 shape 1121, in accordance with one embodiment of the present invention. In other embodiments, a multitude of design rule violation areas may be generated depending on the configuration of the shapes in the design intent. Referring simultaneously to FIG. 12A and FIG. 10, the method checks 1010 the design rule violation areas for each categorized conflict type generating design rule violation area 1230, such as for example a spacing design rule violation.

FIG. 12B depicts the simplified exemplary maximum-minimum fix guidance 1200B similar to maximum-minimum fix guidance 1100A depicted in FIG. 11A. Maximum-minimum fix guidance 1200B includes keep out region 1240 on type 2 shape 1121 in accordance with one embodiment of the present invention. Referring simultaneously to FIGS. 12A-12B and FIG. 10, the method uses design rule violation area 1230 to make keep-out regions for each categorized conflict type generating keep-out region 1240.

FIG. 12C depicts the simplified exemplary maximum-minimum fix guidance 1200B similar to maximum-minimum fix guidance 1100A depicted in FIG. 11A. Maximum-minimum fix guidance 1200B includes a set or one or more possible stitch candidate solutions 1250 for type 2 shape 1121 in accordance with one embodiment of the present invention. Referring simultaneously to FIGS. 12B-12C and FIG. 10, the method, by excluding keep-out region 1240 generates a set of possible stitch candidate solutions for each categorized conflict type generating possible stitch candidate solution 1250.

Figure 13A:
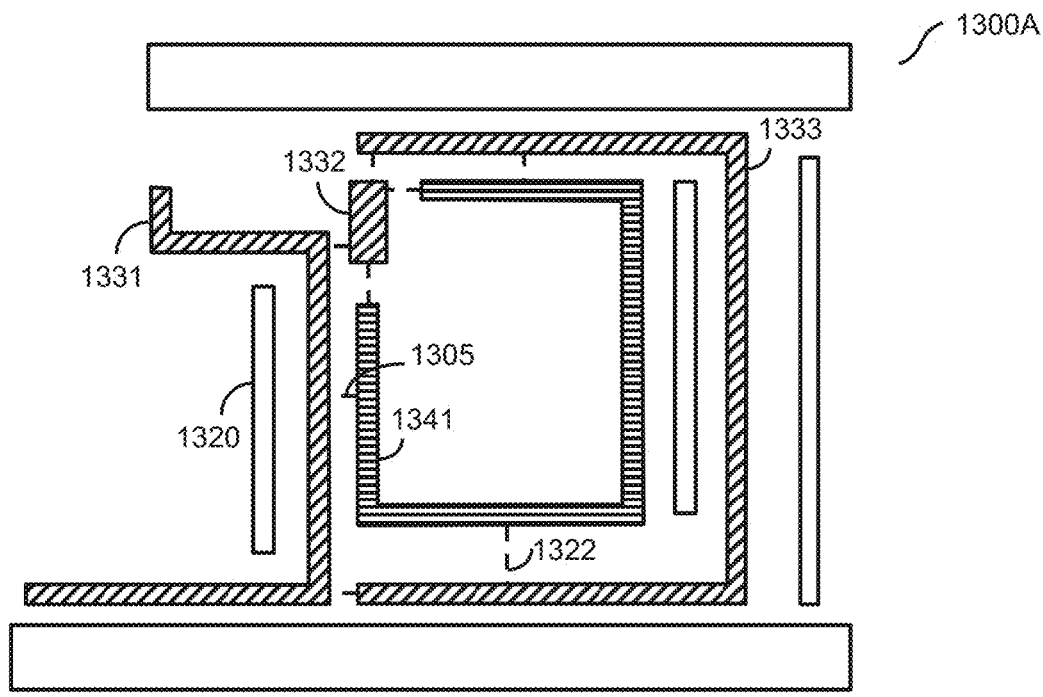
FIG. 13A depict a simplified exemplary maximum-minimum fix guidance used to generate one or more stitch candidates from vertices/shapes.

FIG. 13A depicts another simplified exemplary maximum-minimum fix guidance 1300A used to generate one or more stitch candidates from type 3 and type 4 vertices/shapes, in accordance with one embodiment of the present invention. Simplified exemplary maximum-minimum fix guidance 1300A may include multitude of maximum-minimum conflict links 1305, in accordance with one embodiment of the present invention. Multitude of maximum-minimum conflict links 1305 may be determined by the method analogously as multitude of maximum-minimum conflict links 524 referenced in FIG. 5B above. Maximum-minimum fix guidance 1300A may further include a multitude of three type 3 shapes 1331, 1332, 1333, at least one type 4 shape 1341, and multitude of shapes 1320 of other types or not part of the maximum-minimum fix guidance 1300A shapes. Maximum-minimum conflict links 1305 may include at least one customized minimum conflict link 1322 analogous to customized minimum conflict link 522 depicted in FIGS. 5A-5C.

The method may continue to generate the stitch candidates one conflict type at a time until all the different conflict types in the maximum-minimum fix guidance have been analyzed. In the embodiment depicted in FIGS. 11A and 13A, there are four conflict types that are associated to two different maximum-minimum fix guidance portions of the design intent, by way of example. However, it is understood that depending on the configuration of the shapes in the design intent, other combinations of all the conflict types may be included in at least one of the maximum-minimum fix guidance portions of the design intent or in a multitude of maximum-minimum fix guidance portions of the design intent.

Figure 13B:
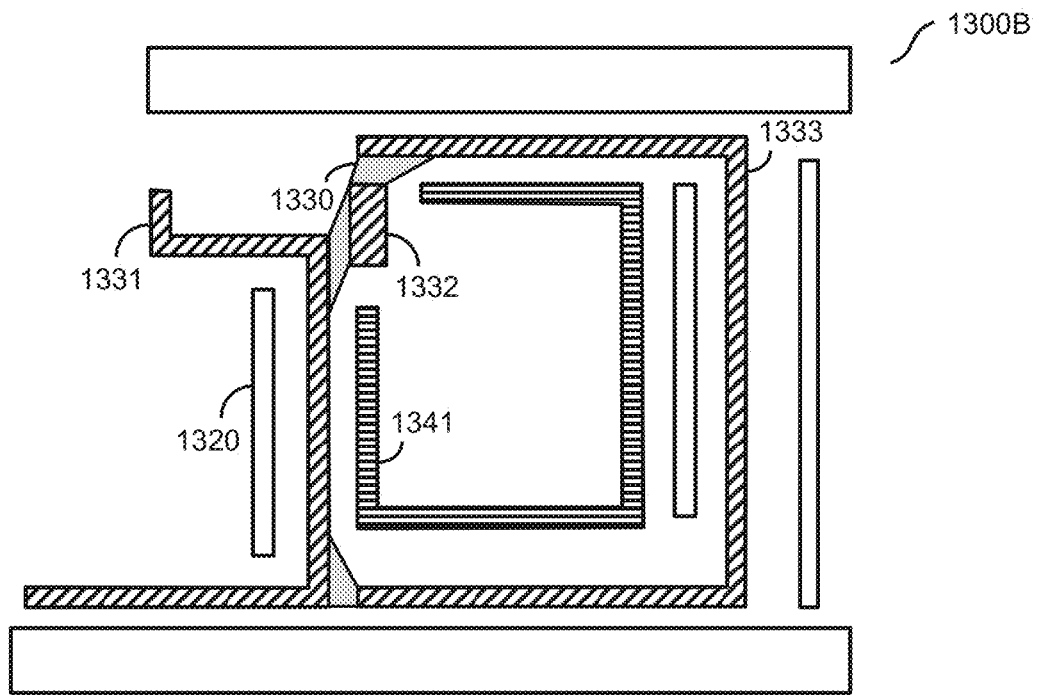
FIGS. 13B-13D depict a simplified exemplary maximum-minimum fix guidance used to generate one or more stitch candidates from vertices/shapes.
Figure 13C:
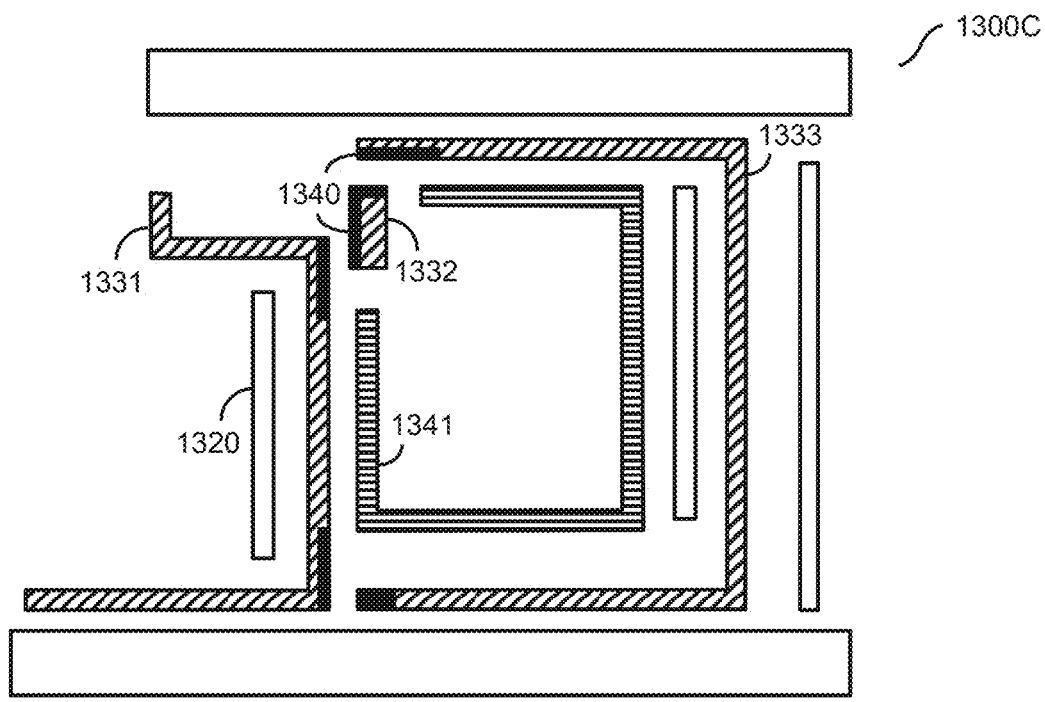
Figure 13D:
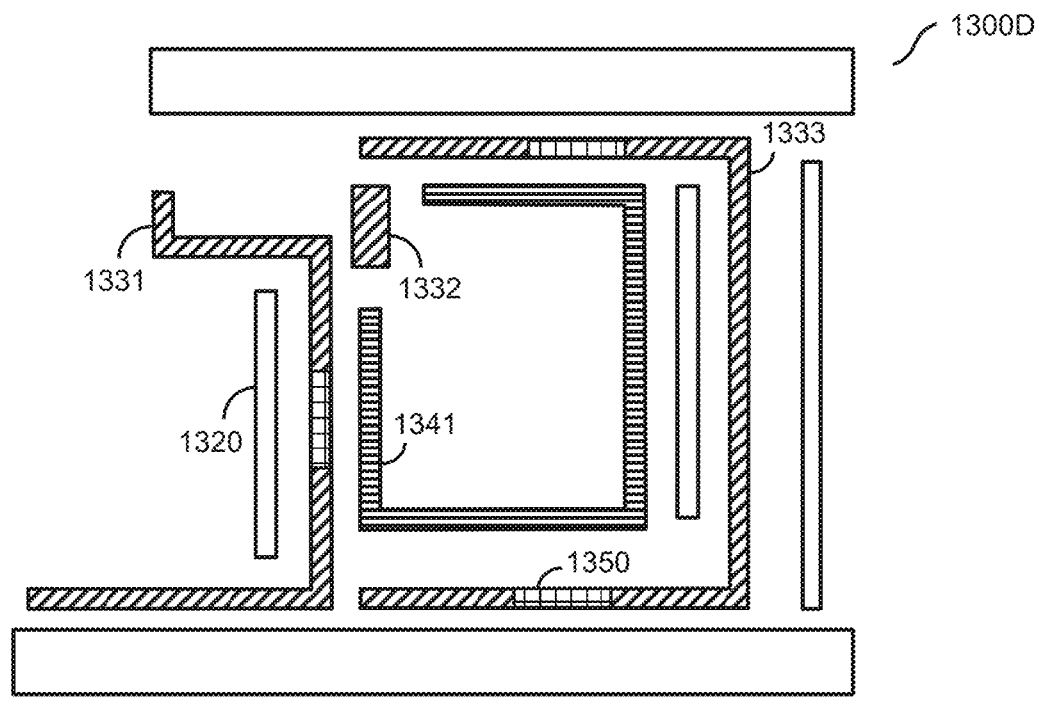

FIGS. 13B-13D depict a simplified exemplary maximum-minimum fix guidance 1300 (e.g. 1300B, 1300C, 1300D) used to generate one or more stitch candidates from type 3 vertices/shapes, in accordance with one embodiment of the present invention. FIG. 13B depicts the simplified exemplary maximum-minimum fix guidance 1300B similar to maximum-minimum fix guidance 1300A depicted in FIG. 13A. Maximum-minimum fix guidance 1300B includes a multitude of design rule violation areas 1130 between multitude of type 3 shapes 1331, 1332, 1333 in accordance with one embodiment of the present invention. Referring simultaneously to FIG. 13B and FIG. 10, the method checks 1010 the design rule violation areas for each categorized conflict type generating multitude of design rule violation areas 1330, such as for example a spacing design rule violation.

FIG. 13C depicts the simplified exemplary maximum-minimum fix guidance 1300C similar to maximum-minimum fix guidance 1300A depicted in FIG. 13A. Maximum-minimum fix guidance 1300C includes multitude of keep out regions 1340 on type 3 shapes 1331, 1332, 1333, in accordance with one embodiment of the present invention. Referring simultaneously to FIGS. 13B-13C and FIG. 10, the method uses design rule violation area 1330 to make keep-out regions for each categorized conflict type generating multitude of keep-out regions 1340.

FIG. 13D depicts the simplified exemplary maximum-minimum fix guidance 1300D similar to maximum-minimum fix guidance 1300A depicted in FIG. 13A except. Maximum-minimum fix guidance 1300D includes a set of or one or more possible stitch candidate solutions 1350 for multitude of type 3 shapes 1331, 1333, in accordance with one embodiment of the present invention. Referring simultaneously to FIGS. 13C-13D and FIG. 10, the method, by excluding keep-out regions 1340, generates a set of or one or more possible stitch candidate solutions for each categorized conflict type generating multitude of possible stitch candidate solutions 1350.

Figure 14A:
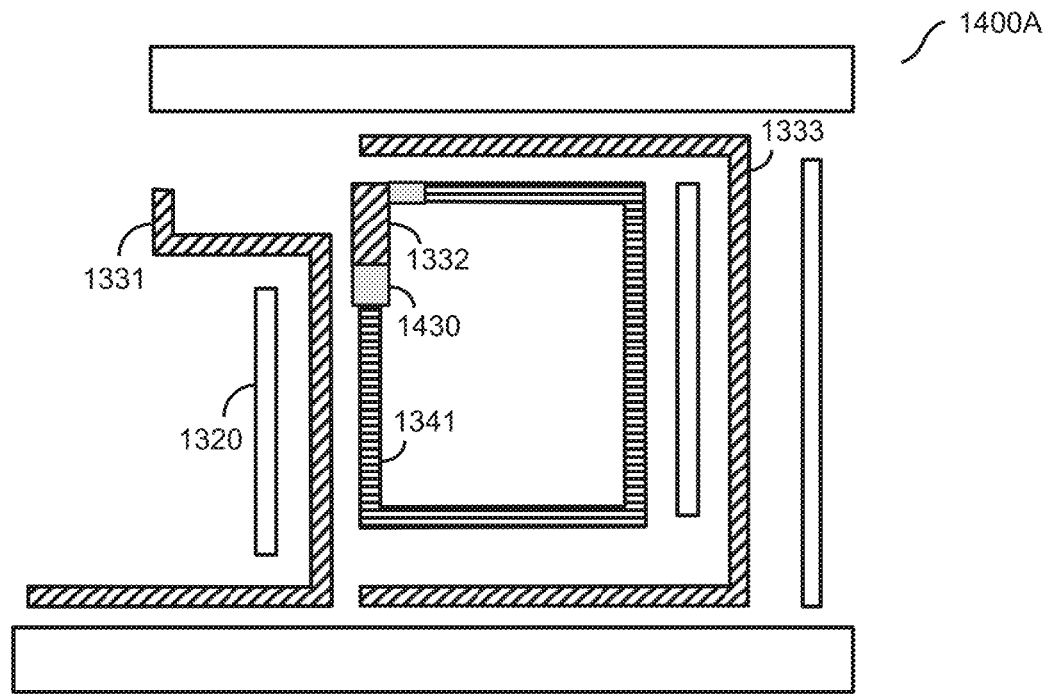
FIGS. 14A-14C depict a simplified exemplary maximum-minimum fix guidance used to generate one or more stitch candidates from vertices/shapes.
Figure 14B:
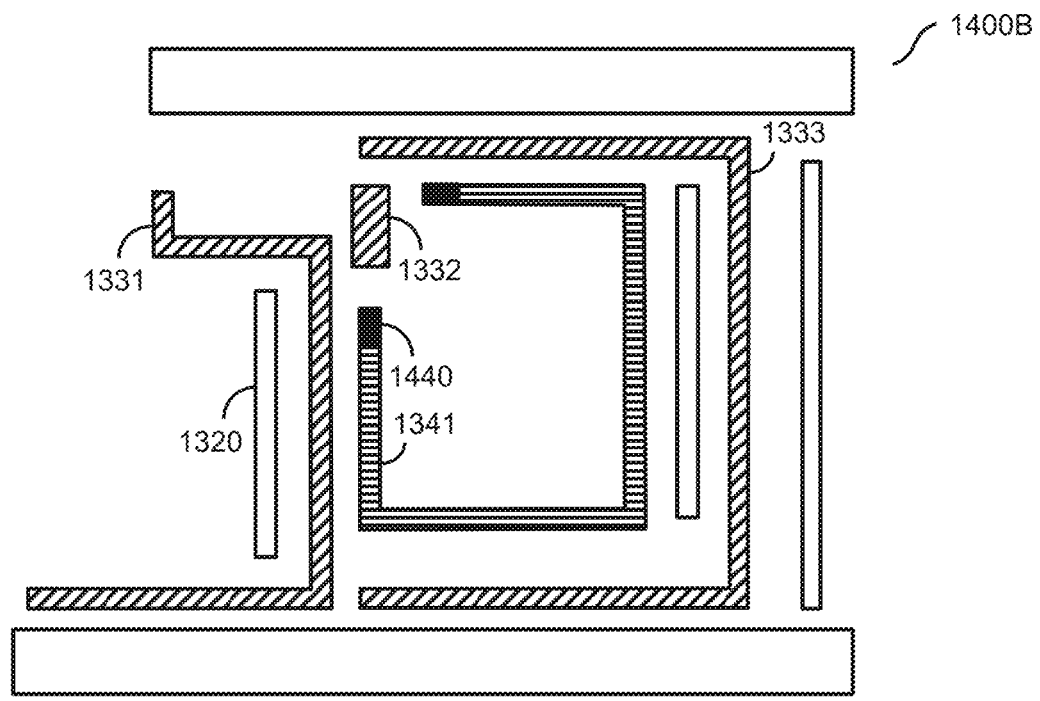
Figure 14C:
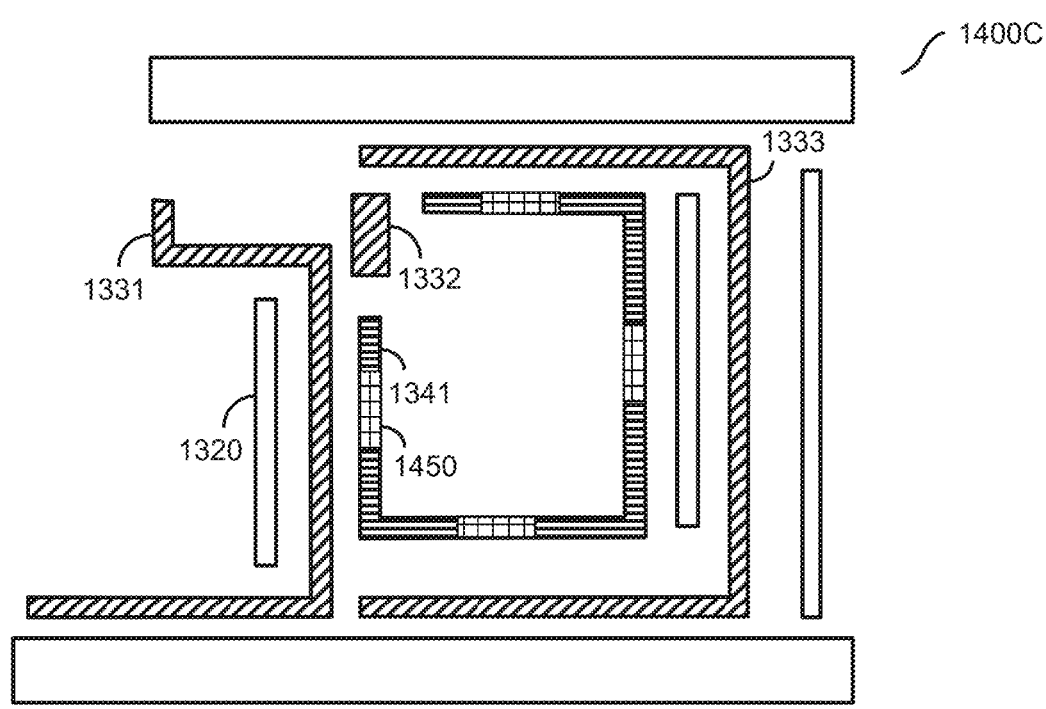

FIGS. 14A-14C depict a simplified exemplary maximum-minimum fix guidance 1400 (e.g. 1400A, 1400B, 1400C) used to generate one or more stitch candidates from type 4 vertices/shapes, in accordance with one embodiment of the present invention. FIG. 14A depicts the simplified exemplary maximum-minimum fix guidance 1400A similar to maximum-minimum fix guidance 1300B depicted in FIG. 13B except. Maximum-minimum fix guidance 1400A includes a multitude of design rule violation areas 1430 between type 3 shape 1332 and type 4 shape 1341, in accordance with one embodiment of the present invention. Referring simultaneously to FIG. 14A and FIG. 10, the method checks 1010 the design rule violation areas for each categorized conflict type generating multitude of design rule violation areas 1430, such as for example a spacing design rule violation.

FIG. 14B depicts the simplified exemplary maximum-minimum fix guidance 1400B similar to maximum-minimum fix guidance 1400A depicted in FIG. 14A. Maximum-minimum fix guidance 1400B includes a multitude of keep out regions 1440 on at least one type 4 shape 1341 in accordance with one embodiment of the present invention. Referring simultaneously to FIGS. 14A-14B and FIG. 10, the method uses multitude of design rule violation areas 1430 to make keep-out regions for each categorized conflict type generating multitude of keep-out regions 1440.

FIG. 14C depicts the simplified exemplary maximum-minimum fix guidance 1400C similar to maximum-minimum fix guidance 1400A depicted in FIG. 11A. Maximum-minimum fix guidance 1400C includes a set of or one or more possible stitch candidate solutions 1450 for at least one type 4 shape 1341 in accordance with one embodiment of the present invention. Referring simultaneously to FIGS. 14B-14C and FIG. 10, the method, by excluding multitude of keep-out regions 1440, generates a set of or one or more possible stitch candidate solutions for each categorized conflict type generating multitude of possible stitch candidate solutions 1450.

Figure 15:
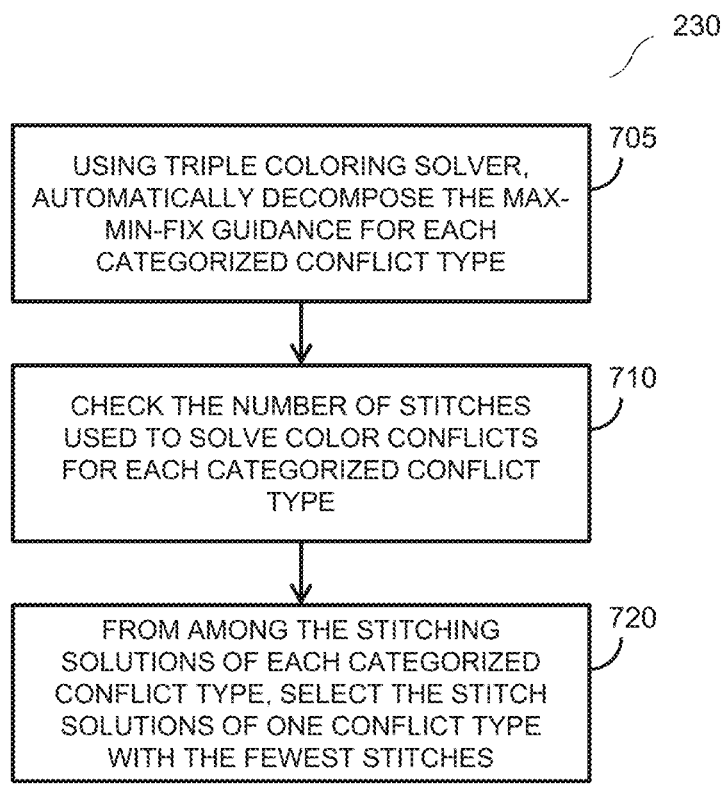
FIG. 15 depicts a simplified flow chart for selecting stitch solutions in the maximum-minimum fix guidance as referenced in FIG. 2.

FIG. 15 depicts a simplified flow chart of a method 230 of selecting stitch solutions in the maximum-minimum fix guidance as referenced in FIG. 2, in accordance with one embodiment of the present invention. The various steps of method 230 may be encoded in computer instructions stored in a non-transitory computer memory. A processor of a computer system may execute the instructions in order to cause the computer system to perform the method. Selecting 230 stitch solutions may include using a triple coloring solver to automatically decompose 705 or color the maximum-minimum fix guidance for each categorized conflict type according to the three or more colors as described earlier. Then the method checks 710 the number of stitches used to solve coloring conflicts for each categorized conflict type. From among the stitching solutions of each categorized conflict type, the method selects 720 the stitch solutions of one conflict type with the fewest stitches. In other words, for any given maximum-minimum fix guidance, the method selects a conflict type with the fewest stitches and outputs the coloring and stitch solution from that selected conflict type. The result of the method is a stitch and coloring solution optimized according to the cost function of fewest stitches, which is desirable to reduce processing complexity and defects.

Figure 16A:
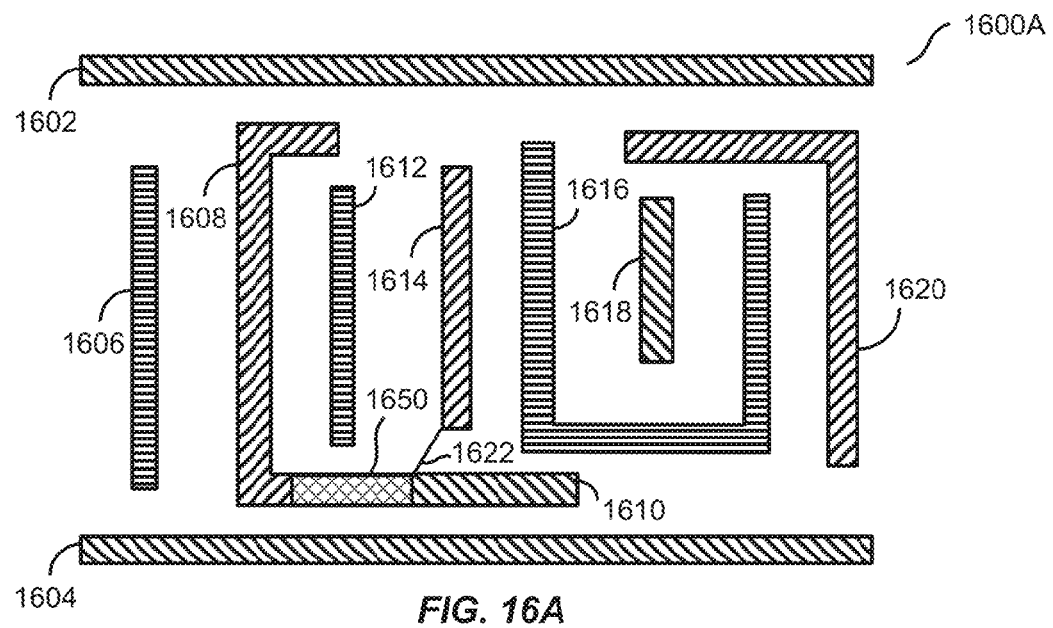
FIGS. 16A, 16B, 17A, and 17B depict simplified exemplary decomposed coloring of maximum-minimum fix guidances using the set of or one or more possible stitch candidate solutions.

FIG. 16A depicts the simplified exemplary decomposed coloring of maximum-minimum fix guidance 1600A attempted using the set of or one or more possible type 1 stitch candidate solutions 1150 depicted in FIG. 11D, in accordance with one embodiment of the present invention. In this example, as described earlier there may not be a possible colorizing solution for conflict type 1, which is why the embodiment is described as "attempted". Referring simultaneously to FIG. 11D, FIG. 15, and FIG. 16A, an attempt has been made to decompose 705 the shapes depicted in maximum-minimum fix guidance 1100D into three or more colors using the possible stitch candidates generated from type 1 shapes/vertices. Maximum-minimum fix guidance 1600A may include shapes 1602, 1604, 1610, 1618 assigned to a first color depicted by a first diagonal fill pattern, shapes 1606, 1612, 1616 assigned to a second color depicted by a horizontal fill pattern, and shapes 1608, 1614, 1620 assigned to a third color depicted by a second diagonal fill pattern. Shapes 1608 and 1610 may be assigned different colors and overlap at a stitch 1650, which was generated from one of the one or more possible type 1 stitch candidate solutions 1150. However, the coloring solution depicted in decomposed coloring of maximum-minimum fix guidance 1600A is not valid because a spacing 1622, indicated by a solid line, does not meet the design rules even though the coloring solution may be the best solution out of the multitude of possible coloring solutions using the type 1 stitch candidates.

Figure 16B:
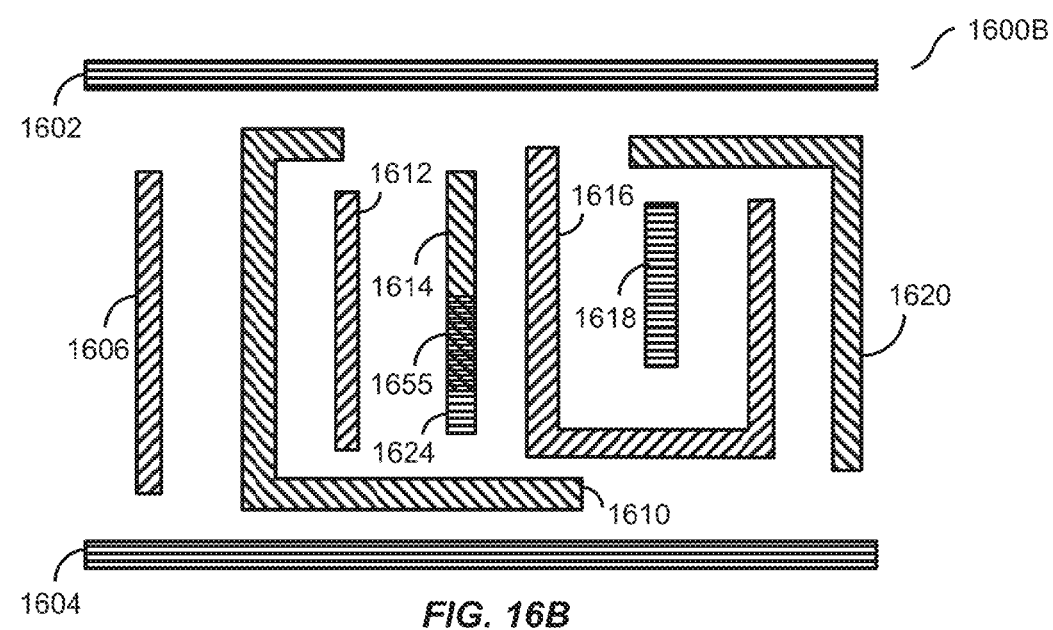

FIG. 16B depicts the simplified exemplary decomposed coloring of maximum-minimum fix guidance 1600B using the set of or one or more possible type 2 stitch candidate solutions 1250 depicted in FIG. 12C, in accordance with one embodiment of the present invention. Referring simultaneously to FIG. 12C, FIG. 15, and FIG. 16B, the shapes depicted in maximum-minimum fix guidance 1200C have been decomposed 705 into three or more colors using the possible stitch candidates generated from type 2 shapes/vertices. Maximum-minimum fix guidance 1600B may include shapes 1610, 1614, 1620 assigned to a first color depicted by a first diagonal fill pattern, shapes 1602, 1604, 1618, 1624 assigned to a second color depicted by a horizontal fill pattern, and shapes 1606, 1612, 1616 assigned to a third color depicted by a second diagonal fill pattern. Shapes 1614 and 1624 may be assigned different colors and overlap at a stitch 1655, which was generated from one of the one or more possible type 2 stitch candidate solutions 1250.

It is noted that the coloring solution for decomposed coloring of maximum-minimum fix guidance 1600B may be different that the coloring solution for decomposed coloring of maximum-minimum fix guidance 1600A. Referring to FIG. 15 and FIG. 16A-16B, the method checks 710 the number of valid stitches in decomposed coloring of maximum-minimum fix guidance 1600B is one and that there are no valid stitches in decomposed coloring of maximum-minimum fix guidance 1600A. Therefore the method selects 720 decomposed coloring of maximum-minimum fix guidance 1600B as the solution because it is the only choice and has the fewest stitches by default.

Figure 17A:
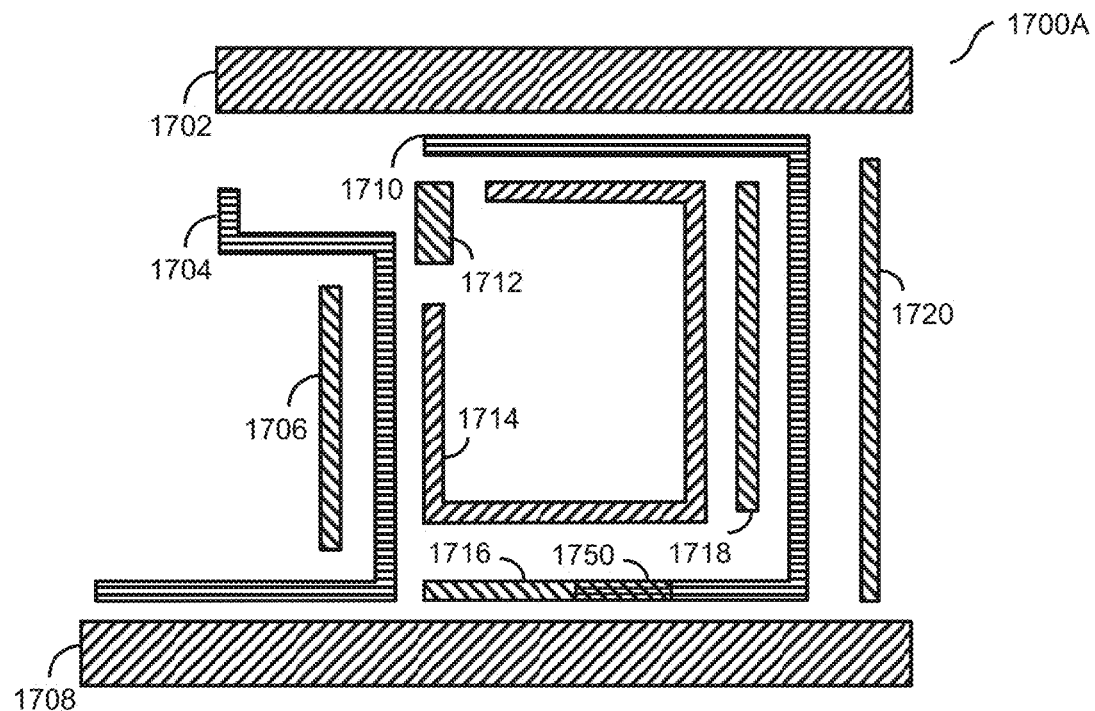

FIG. 17A depicts the simplified exemplary decomposed coloring of maximum-minimum fix guidance 1700A using the set of or one or more possible type 3 stitch candidate solutions 1350 depicted in FIG. 13D, in accordance with one embodiment of the present invention. Referring simultaneously to FIG. 13D, FIG. 15, and FIG. 17A, the shapes depicted in maximum-minimum fix guidance 1300D have been decomposed 705 into three or more colors using the possible stitch candidates generated from type 3 shapes/vertices. Maximum-minimum fix guidance 1700A may include shapes 1706, 1712, 1716, 1718, 1720 assigned to a first color depicted by a first diagonal fill pattern, shapes 1704, 1710 assigned to a second color depicted by a horizontal fill pattern, and shapes 1702, 1708, 1714 assigned to a third color depicted by a second diagonal fill pattern. Shapes 1710 and 1716 may be assigned different colors and overlap at a stitch 1750, which was generated from one of the one or more possible type 3 stitch candidate solutions 1350.

Figure 17B:
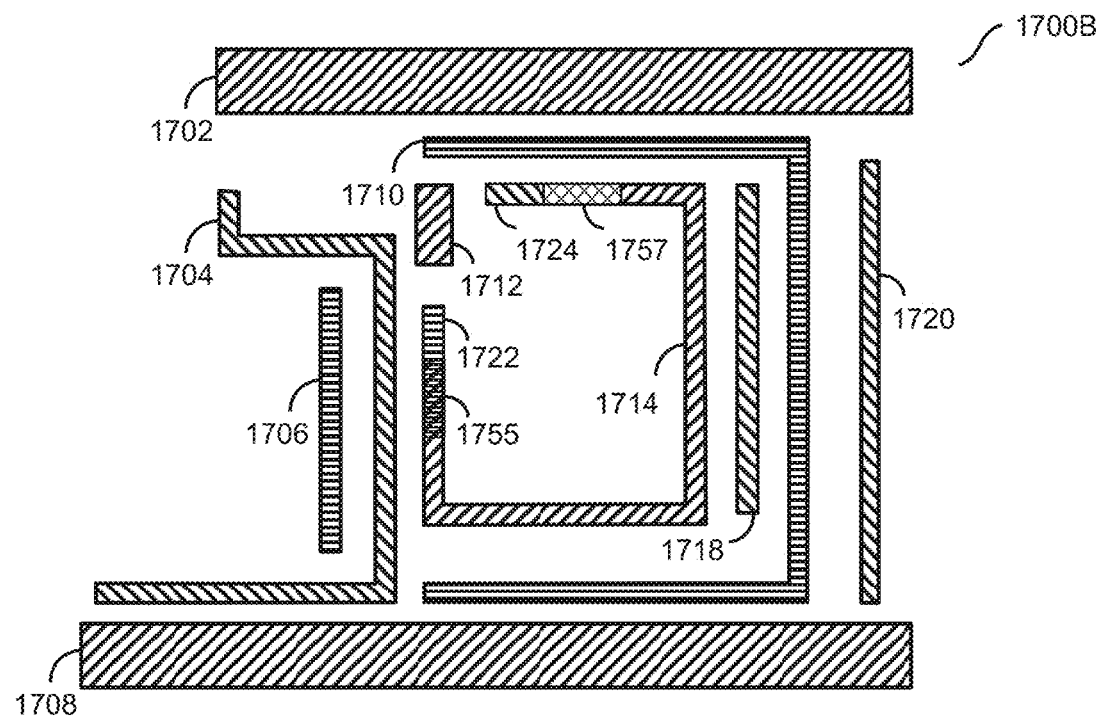

FIG. 17B depicts the simplified exemplary decomposed coloring of maximum-minimum fix guidance 1700B using the set of or one or more possible type 4 stitch candidate solutions 1450 depicted in FIG. 14C, in accordance with one embodiment of the present invention. Referring simultaneously to FIG. 14C, FIG. 15, and FIG. 17B, the shapes depicted in maximum-minimum fix guidance 1400C have been decomposed 705 into three or more colors using the possible stitch candidates generated from type 4 shapes/vertices. Maximum-minimum fix guidance 1700B may include shapes 1704, 1718, 1720, 1724 assigned to a first color depicted by a first diagonal fill pattern, shapes 1706, 1710, 1722 assigned to a second color depicted by a horizontal fill pattern, and shapes 1702, 1708, 1712, 1714 assigned to a third color depicted by a second diagonal fill pattern. Shapes 1714 and 1722 may be assigned different colors and overlap at a stitch 1755, which was generated from one of the one or more possible type 4 stitch candidate solutions 1450. Shapes 1714 and 1724 may be assigned different colors and overlap at a stitch 1757, which was generated from one of the one or more possible type 4 stitch candidate solutions 1450.

It is noted that the coloring solution for decomposed coloring of maximum-minimum fix guidance 1700B may be different that the coloring solution for decomposed coloring of maximum-minimum fix guidance 1700A. Referring to FIG. 15 and FIG. 17A-17B, the method checks 710 the number of valid stitches in decomposed coloring of maximum-minimum fix guidance 1700A is one and that the number of valid stitches in decomposed coloring of maximum-minimum fix guidance 1700B is two. Therefore the method selects 720 decomposed coloring of maximum-minimum fix guidance 1700A as the solution because there are fewer stitches in decomposed coloring of maximum-minimum fix guidance 1700A than in decomposed coloring of maximum-minimum fix guidance 1700B. In one embodiment, the method may output the valid decomposed coloring of maximum-minimum fix guidance for all the possible solutions including solutions with more than the minimum number of stitches so that the designer may select a solution based on a different cost function than minimizing the number of stitches, by outputting the results from generating 220 the set of possible stitch candidate solutions depicted in FIG. 2.

Figure 18A:
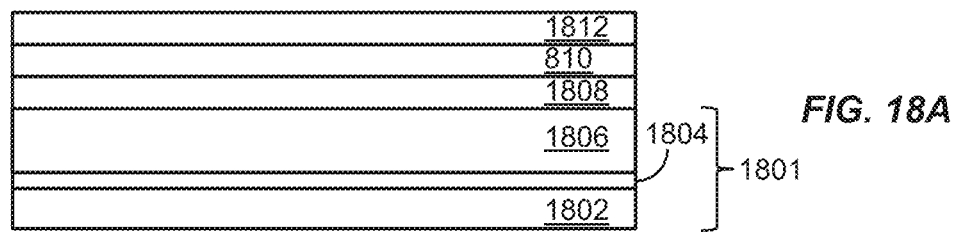
FIGS. 18A-18W depict simplified exemplary cross-sections of a process flow using a triple-patterning process.
Figure 18W:
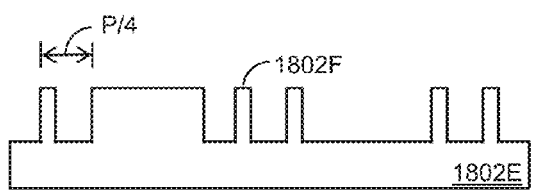
Figure 19:
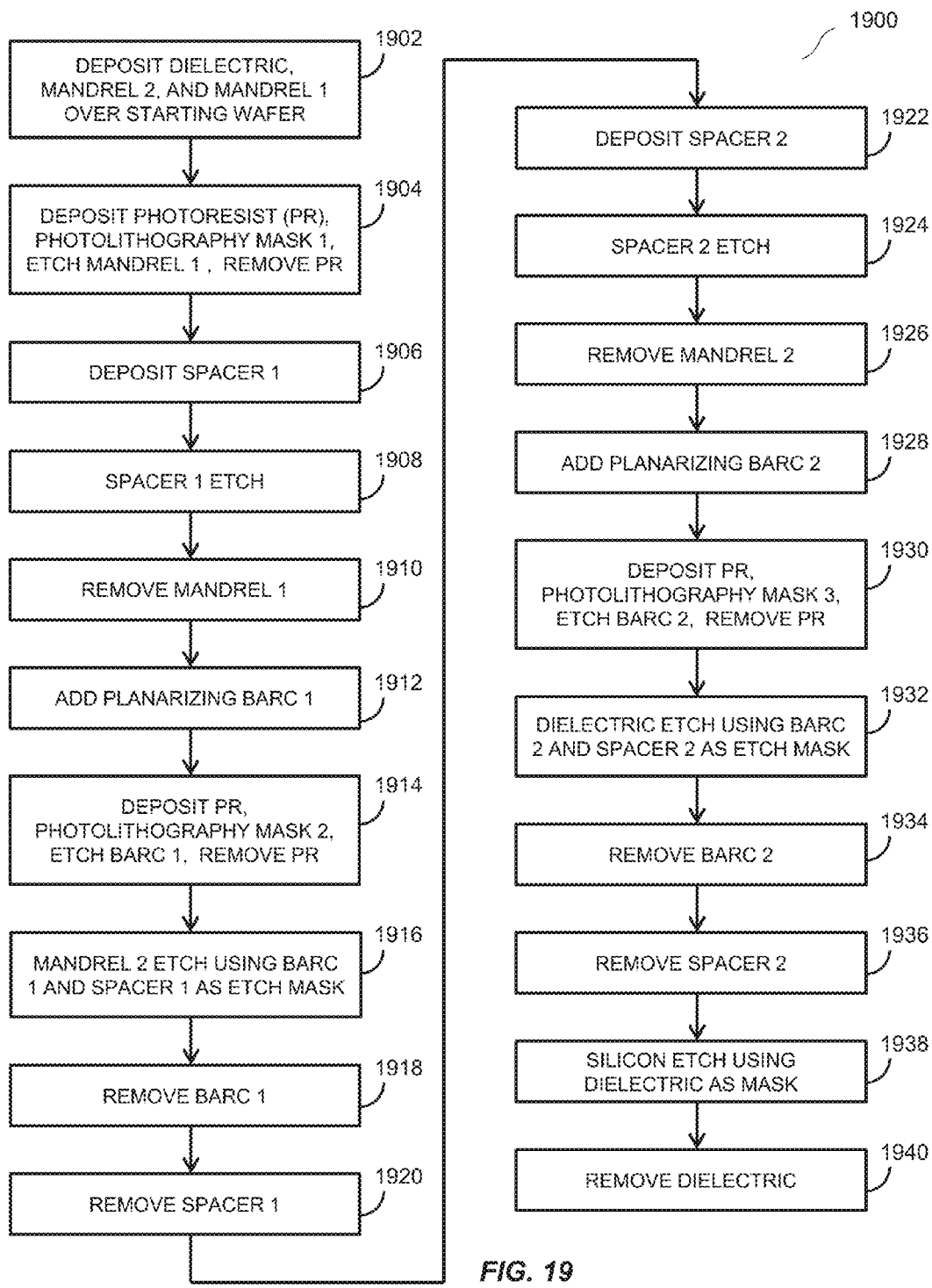
FIG. 19 depicts a simplified exemplary flowchart 1900 for the process flow depicted in FIGS. 18A-18W.

In one embodiment, triple-patterning technology may use three different masks to produce higher pattern density or pitch in a design intent than is achievable by using just one or two masks to print a single feature in the pitch during process flow manufacturing. FIGS. 18A-18W depict simplified exemplary cross-sections of a process flow using a triple-patterning process, in accordance with one embodiment of the present invention. FIG. 19 depicts a simplified exemplary flowchart 1900 for the process flow depicted in FIGS. 18A-18W, in accordance with one embodiment of the present invention. Referring simultaneously to FIGS. 18A-18W and FIG. 19, a starting wafer 1801 may include a thin dielectric layer 1804, also referred to herein as a buried oxide (BOX), formed between a silicon substrate 1802 and a crystalline silicon layer 1806. Crystalline silicon layer 1806 may be formed by bonding a second single crystal silicon wafer to another first single crystal silicon wafer that was previously oxidized and then cutting the second single crystal silicon wafer to the thickness desired for crystalline silicon layer 1806. In an alternative embodiment, starting wafer 1801 may include a single crystal silicon wafer without the BOX processing. The following description will refer to the BOX process flow by example, however as will be seen, it is understood that a single crystal silicon wafer without the BOX processing may be used in an alternative embodiment.

As depicted in FIG. 18A, a multitude of layers including layers with different etching characteristics may be deposited 1902 so as to overlay crystalline silicon layer 1806. For example, a dielectric layer 1808 may be deposited to overlay crystalline silicon layer 1806 followed by depositing a mandrel 2 layer 1810 to overlay dielectric layer 1808. Then, a mandrel 1 layer 1812 may be deposited to overlay mandrel 2 layer 1810. In alternative embodiments, different layers than those described above may be used, such as for example a greater number of layers than the three deposited layers described above may be used depending on the etching characteristics of the layers used.

Figure 18B:
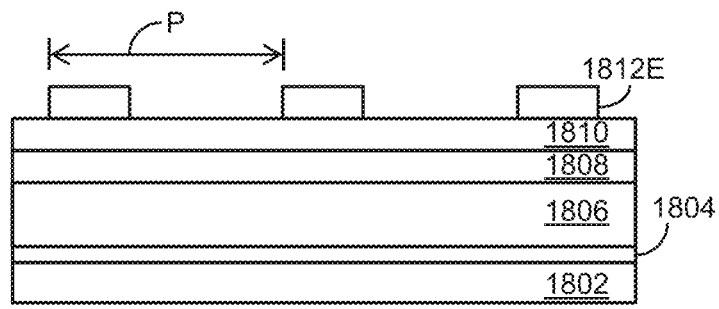

After the deposition 1902 of the multitude of layers, a photolithography sequence 1904 applies photoresist (PR) (not shown), exposes the PR using a mask 1, develops the PR, and etches mandrel 1 layer 1812, and removes the PR leaving the pattern of mask 1 in mandrel 1 pattern 1812E as depicted in FIG. 18B. Various alternative steps for the photolithography sequence are possible. The pattern of mask 1 in mandrel 1 pattern 1812E may include a pattern having a minimum process technology pitch, P, as shown by the arrow that includes the sum of a minimum line and minimum space. In other words, although the line within P may be processed wider or narrower, the sum of the line and space within P may not be processed any smaller for this technology example using just one photolithography sequence using just one mask.

Figure 18C:
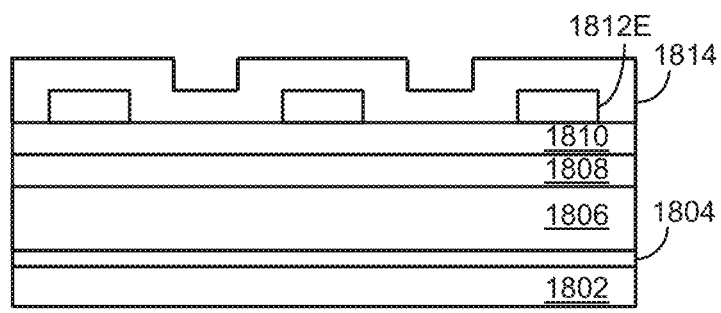
Figure 18D:
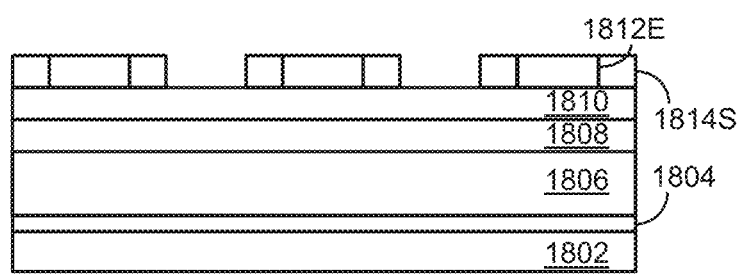
Figure 18E:
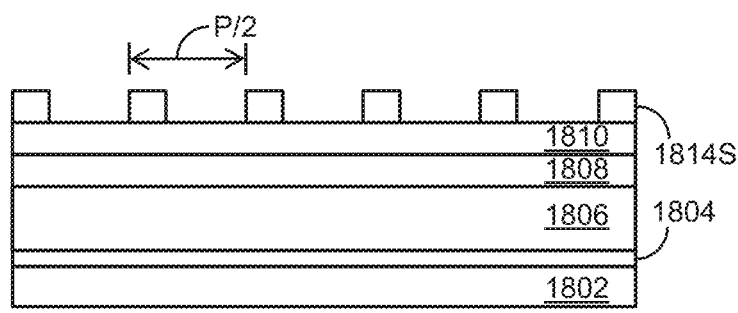
Figure 18F:
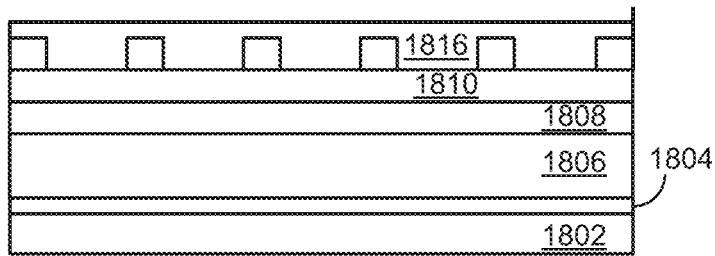

Next, a spacer 1 layer 1814 may be deposited 1906 in conformal fashion so as to overlay the mandrel 1 pattern 1812E as depicted in FIG. 18C. Then, spacer 1 layer 1814 may be etched 1908 so as to leave behind spacers 1 structures 1814S at the sidewalls of mandrel 1 pattern 1812E as depicted in FIG. 18D. Then, mandrel 1 pattern 1812E may be removed 1910 as depicted in FIG. 18E. It should be noted that the pitch in spacers 1 structures 1814S may be about half of P as shown by the arrows. Next, a planarizing bottom anti-reflective coating 1 (BARC 1) layer 1816 may be added 1912 so as to overlay spacers 1 structures 1814S and mandrel 2 layer 1810 as depicted in FIG. 18F.

Figure 18G:
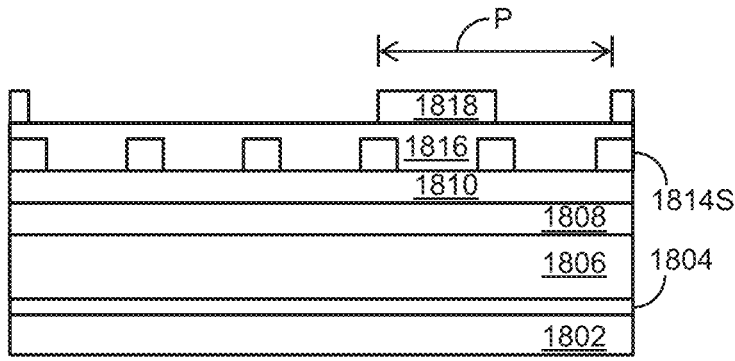
Figure 18H:
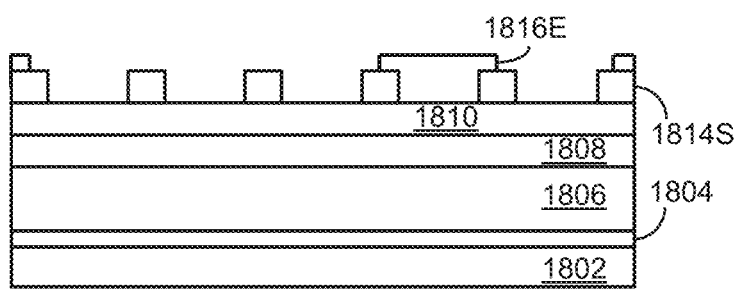
Figure 18I:
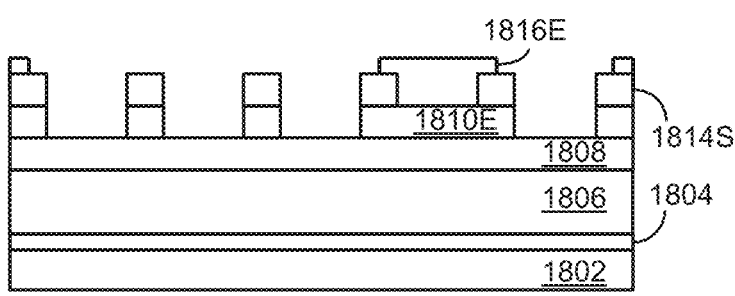
Figure 18J:
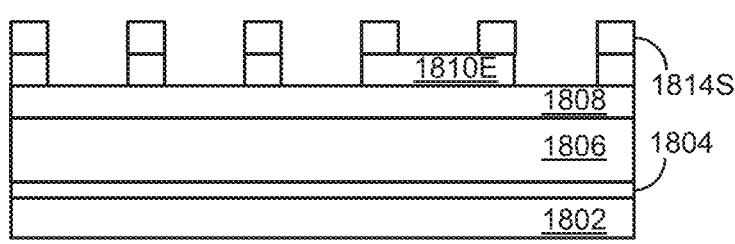
Figure 18K:
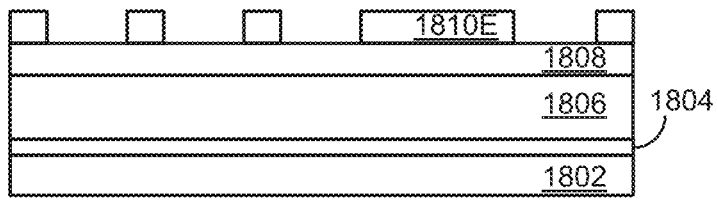

Then, a second photolithography sequence 1914 applies a PR layer, exposes the PR using a mask 2, develops the PR leaving PR pattern 1818, which again may be patterned with pitch P as shown by the arrows in FIG. 18G. BARC 1 layer 1816 may be etched leaving BARC 1 pattern 1816E after PR removal as depicted in FIG. 18H. Next, mandrel 2 layer 1810 may be etched 1916 using BARC 1 pattern 1816E and spacers 1 structures 1814S as hard-masks leaving behind mandrel 2 pattern 1810E as depicted in FIG. 18I. Then, BARC 1 pattern 1816E may be removed 1918 as depicted in FIG. 18J. Next, FIG. 18K depicts the cross-section after spacers 1 structures 1814S are removed 1920 and provide patterns having about one half the pitch available using a single photolithography mask.

Figure 18L:
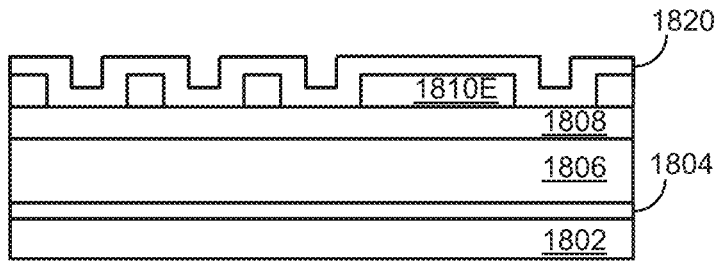
Figure 18M:
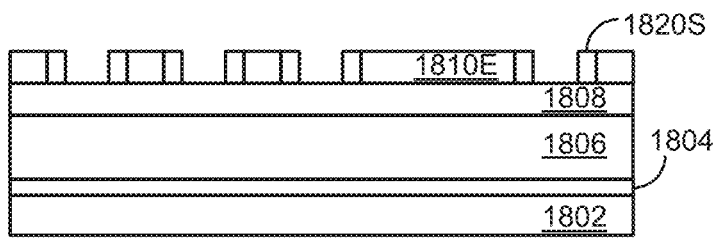
Figure 18N:
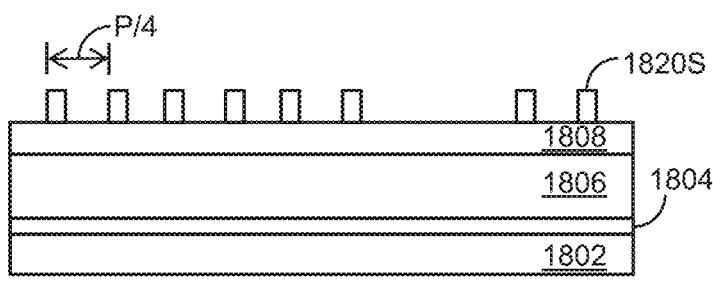
Figure 18O:
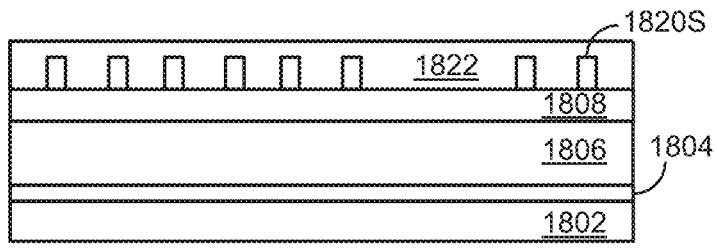

Next, a spacer 2 layer 1820 may be deposited 1922 in conformal fashion so as to overlay the mandrel 2 pattern 1810E as depicted in FIG. 18L. Then, spacer 2 layer 1820 may be etched 1924 so as to leave behind spacers 2 structures 1820S at the sidewalls of mandrel 2 pattern 1810E as depicted in FIG. 18M. Then, mandrel 2 pattern 1810E may be removed 1926 as depicted in FIG. 18N. It should be noted that the pitch in spacers 2 structures 1820S may be about one fourth of P as shown by the arrows. Next, a planarizing bottom anti-reflective coating 2 (BARC 2) layer 1822 may be added 1928 so as to overlay spacers 2 structures 1820S and dielectric layer 1808 as depicted in FIG. 18O.

Figure 18P:
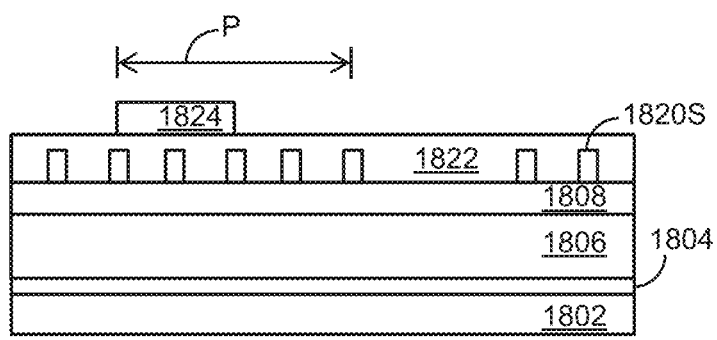
Figure 18Q:
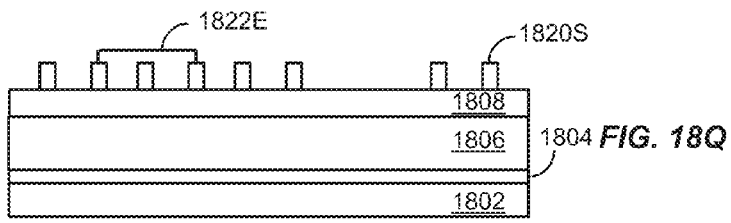
Figure 18R:
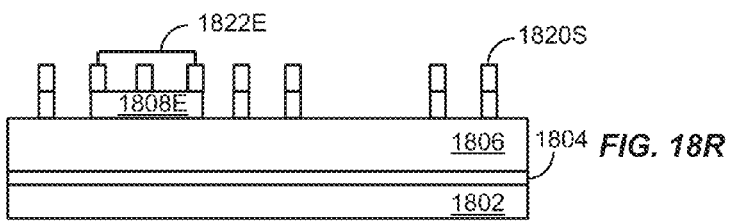
Figure 18S:
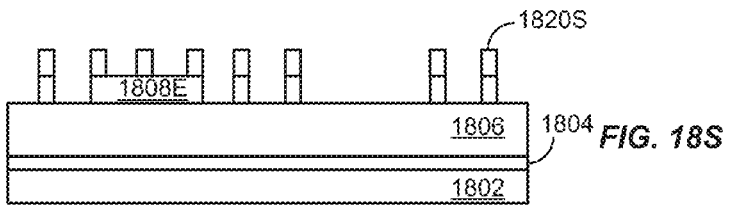
Figure 18T:
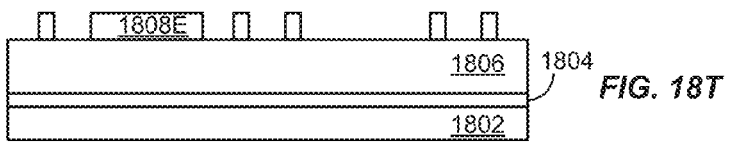
Figure 18U:
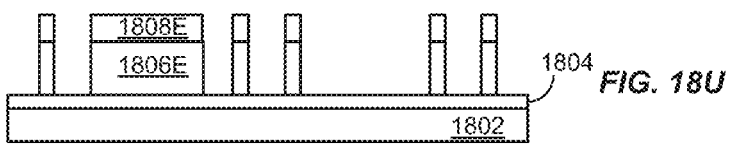
Figure 18V:
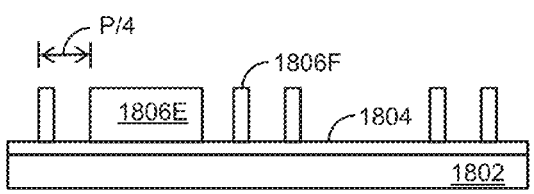

Then, a third photolithography sequence 1930 applies a PR layer, exposes the PR using a mask 3, develops the PR leaving patterned PR layer 1824, which again may be patterned with pitch P as shown by the arrows in FIG. 18P. BARC 2 layer 1822 may be etched leaving BARC 2 pattern 1822E after PR removal as depicted in FIG. 18Q. Next, dielectric layer 1808 may be etched 1932 using BARC 2 pattern 1822E and spacers 2 structures 1820S as hard-masks leaving behind dielectric pattern 1808E as depicted in FIG. 18R. Then, BARC 2 pattern 1822E may be removed 1934 as depicted in FIG. 18S. Next, FIG. 18T depicts the cross-section after spacers 2 structures 1820S are removed 1936. Then dielectric pattern 1808E may be used as a hard mask to etch 1938 crystalline silicon layer 1806 as depicted in FIG. 18U. Next, dielectric pattern 1808E may be removed as depicted in FIG. 18V leaving crystalline silicon pattern 1806E, which in-turn includes crystalline silicon fins 1806F. In an alternative embodiment, when the single crystal silicon wafer without the BOX processing may be used, the processing sequence of steps 1904 through 1940 may be similar, resulting in the cross-section depicted in FIG. 18W, which includes crystalline silicon pattern 1802E, which in-turn includes crystalline silicon fins 1802F.

The resulting patterns in crystalline silicon patterns 1806E and 1802E may be complex, including sections without fins where the crystalline silicon layer 1806 or crystalline silicon substrate 1802 are not etched, for example, pedestals or plateaus, and sections where the crystalline silicon layer 1806 is etched away or crystalline silicon substrate 1802 is etched forming a wide trench. Further, the resulting patterns in crystalline silicon patterns 1806E and 1802E may include a pitch that is about one fourth the pitch available using just a single mask. Thus, the pitch achievable using triple-patterning technology may be about half the pitch achievable using double-patterning technology and about one fourth the pitch achievable using a single mask, which leads to greater density integrated circuits using triple patterning, as depicted by the arrows in FIG. 18V and FIG. 18W.

The complex crystalline silicon patterns 1806E and 1802E are made possible, in-part, because of the validation embodiments of the present invention referred to in FIG. 2 through FIG. 17B, which may be performed for the design intents and associated shapes used in mask 1 through mask 3 referenced in FIGS. 18B, 18G, 18P and associated respective photolithography sequences 1904, 1914, 1930 referenced in FIG. 19. The crystalline silicon fins 1806F, 1802F depicted in FIG. 18V and FIG. 18W may be subsequently used in the fabrication of three dimensional transistors such as fin-FETs or triple-gate FETs requiring smaller pitch than that available using a single mask or double patterning technology. In alternative embodiments, other process flows may be used to analogously form structures such as gates for other types of transistors as well as metal interconnects using a metal trench fill and chemical mechanical polish CMP planarization process.

Figure 20:
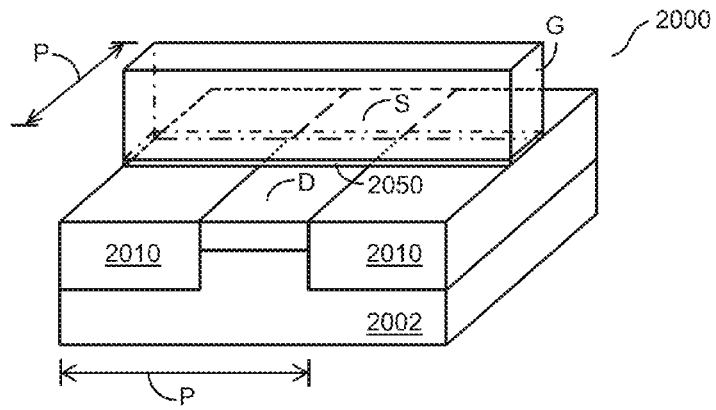
FIG. 20 depicts a simplified exemplary perspective view of an insulated-gate field-effect-transistor (IG-FET).

FIG. 20 depicts a simplified exemplary perspective view of an insulated-gate field-effect-transistor (IG-FET) 2000. IG-FET 2000 may include a crystalline silicon substrate 2002, shallow trench isolation 2010 (STI dielectric) formed on each side of a crystalline silicon pedestal, a gate dielectric 2050 formed between the crystalline silicon pedestal and a gate, G, formed as a stripe running lengthwise in the plane of FIG. 20 and over STI 2010. IG-FET 2000 may further include source S and drain D regions formed by implanting dopant atoms into the crystalline silicon pedestal in self aligned fashion on each side of gate G. The minimum pitch P normally available for the STI/crystalline silicon pedestal and/or the gate patterns is depicted by the arrows. The circuit density achievable is thus limited in-part by pitch P. The power wasted by IG-FET 2000 may be limited by leakage currents between D and S that are not under the control of G and may in aggregate over a multitude of transistors further limit circuit density.

Figure 21:
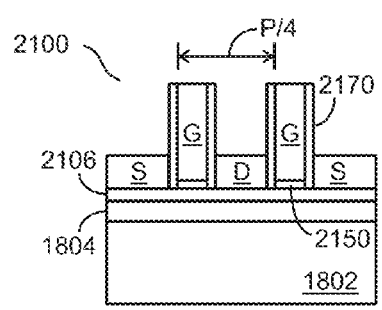
FIG. 21 depicts a simplified exemplary cross-section view of a fully-depleted silicon-on-insulator (FDSOI) FET manufactured using a triple-patterning process.

FIG. 21 depicts a simplified exemplary cross-section view of a fully-depleted silicon-on-insulator (FDSOI) FET 2100 manufactured using a triple-patterning process, in accordance with one embodiment of the present invention. FDSOI FET 2100 may include a starting wafer similar to starting wafer 1801 referenced above in FIG. 18A except overlying BOX layer 1804, a crystalline silicon layer 2106 includes a thickness that may be thinner than crystalline silicon layer 1806 used for fin-FET manufacture. FDSOI FET 2100 may further include a pair of connected gates G. In accordance with one embodiment of the present invention, the design intent used to form pair of connected gates G may be validated and patterned using the triple patterning embodiments described herein with a pitch P/4 as depicted by the arrows to increase circuit density. In other words, shapes in the design intents referenced in FIG. 2 through FIG. 17B may correspond to shapes used to manufacture a FDSOI FET using a multi-patterning or triple-patterning manufacturing technology. Pair of connected gates G may have spacers 2170 formed between the gates G and raised doped silicon S and D regions. FDSOI FET 2100 may have reduced leakage characteristics because the silicon channel region immediately below the gates G may be formed thinner using a thin crystalline silicon layer 2106 so as to be fully depleted by the gates G when FDSOI FET 2100 is biased off.

Figure 22:
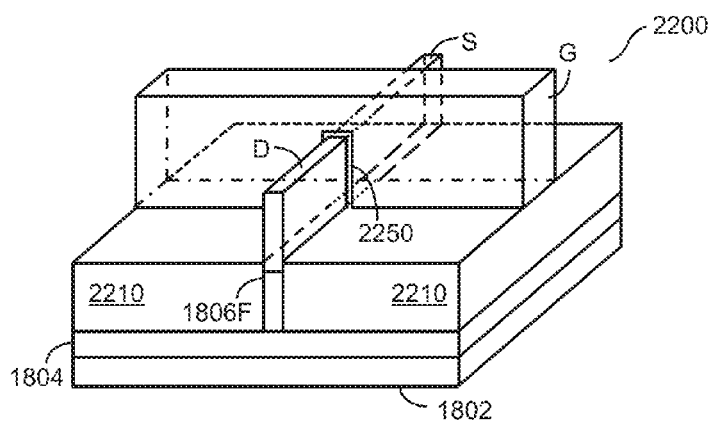
FIG. 22 depicts a simplified exemplary perspective view of a fin-FET transistor.

FIG. 22 depicts a simplified exemplary perspective view of a fin-FET transistor 2200. Fin-FET transistor 2200 may include starting wafer 1801 referenced above in FIG. 18A, fin 1806F referenced in FIG. 18V, STI regions 2210, gate G formed overlaying and surrounding the portion of fin 1806F above STI 2210, gate dielectric 2250 between the portion of fin 1806F above STI 2210 and gate G, and S and D doped regions in the portion of fin 1806F slightly below the surface of STI 2210 and on each side of gate G. The channel region may deplete fully when the gate is biased off because fin 1806F is narrow and the gate surrounds the channel on at least two sides. Analogous fin-FET structures may be formed using the starting wafer 1801 without BOX processing as described in reference to FIG. 18W.

Figure 23:
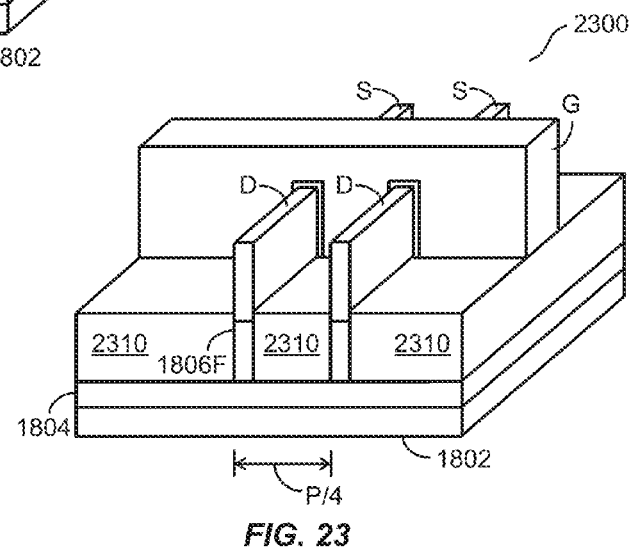
FIG. 23 depicts a simplified exemplary perspective view of a fin-FET transistor.

FIG. 23 depicts a simplified exemplary perspective view of a fin-FET transistor 2300 manufactured, in part, using the triple-patterning process depicted in FIGS. 18A-18W and FIG. 19, in accordance with one embodiment of the present invention. Fin-FET transistor 2300 may include a pair of fins 1806F with S and D respectively connected in parallel to form a single FET with double the current drive capability compared to fin-FET transistor 2200. STI 2310 may be formed on each side of the pair of fins 1806F. Pair of fins 1806F may be manufactured with pitch P/4, as depicted by the arrows, using triple patterning technology as depicted in FIG. 18V or FIG. 18W providing higher circuit density that achievable using single mask or double-patterning technology. The design intent used to form the pair of parallel connected fins 1806F may be validated using the triple-patterning embodiments of the present invention referred to in FIG. 2 through FIG. 17B. In other words, shapes in the design intents referenced in FIG. 2 through FIG. 17B may correspond to shapes used to manufacture a fin-FET or triple-gate FET using a multi-patterning or triple-patterning manufacturing technology. The triple-patterning validation for fin-FET transistor 2300 may be performed on the design intents and associated shapes used in mask 1 through mask 3 referenced in FIGS. 18B, 18G, 18P before the triple-patterning wafer process for associated respective photolithography sequences 1904, 1914, 1930 referenced in FIG. 19. It would be understood that fins 1802F referenced in FIG. 18W may be used optionally replacing fins 1806F when BOX processing is not used.

Figure 24:
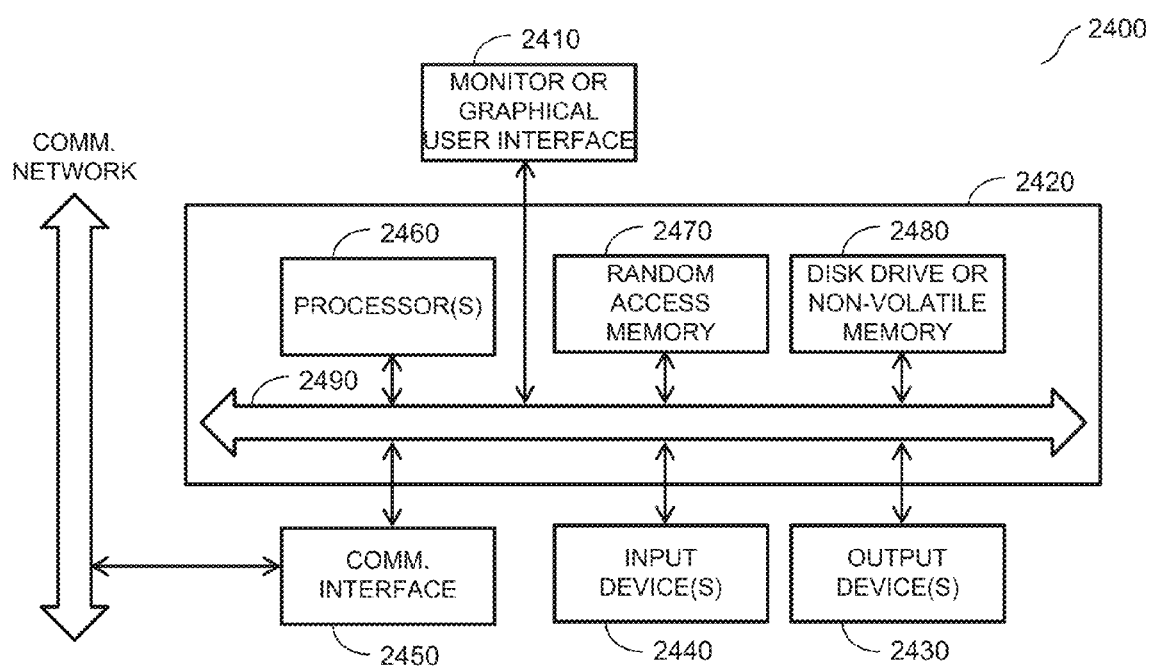
FIG. 24 is a block diagram of a computer system that may implement the features, aspects, and steps of the methods discussed herein.

FIG. 24 is a block diagram of a computer system that may implement the features, aspects, and steps of the methods discussed herein. FIG. 24 is merely illustrative of an embodiment incorporating the present invention and does not limit the scope of the invention as recited in the claims. One of ordinary skill in the art would recognize other variations, modifications, and alternatives.

In one embodiment, computer system 2400 typically includes a monitor 2410, a computer 2420, user output devices 2430, user input devices 2440, communications interface 2450, and the like.

As shown in FIG. 24, computer 2420 may include a processor(s) 2460 that communicates with a number of peripheral devices via a bus subsystem 2490. These peripheral devices may include user output devices 2430, user input devices 2440, communications interface 2450, and a storage subsystem, such as random access memory (RAM) 2470 and disk drive 2480.

User input devices 2430 include all possible types of devices and mechanisms for inputting information to computer system 2420. These may include a keyboard, a keypad, a touch screen incorporated into the display, audio input devices such as voice recognition systems, microphones, and other types of input devices. In various embodiments, user input devices 2430 are typically embodied as a computer mouse, a trackball, a track pad, a joystick, wireless remote, drawing tablet, voice command system, eye tracking system, and the like. User input devices 2430 typically allow a user to select objects, icons, text and the like that appear on the monitor 2410 via a command such as a click of a button or the like.

User output devices 2440 include all possible types of devices and mechanisms for outputting information from computer 2420. These may include a display (e.g., monitor 2410), non-visual displays such as audio output devices, etc.

Communications interface 2450 provides an interface to other communication networks and devices. Communications interface 2450 may serve as an interface for receiving data from and transmitting data to other systems. Embodiments of communications interface 2450 typically include an Ethernet card, a modem (telephone, satellite, cable, ISDN), (asynchronous) digital subscriber line (DSL) unit, FireWire interface, USB interface, and the like. For example, communications interface 2450 may be coupled to a computer network, to a FireWire bus, or the like. In other embodiments, communications interfaces 2450 may be physically integrated on the motherboard of computer 2420, and may be a software program, such as soft DSL, or the like.

In various embodiments, computer system 2400 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 2420 includes one or more Xeon microprocessors from Intel as processor(s) 2460. Further, one embodiment, computer 2420 includes a UNIX-based operating system.

RAM 2470 and disk drive 2480 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 2470 and disk drive 2480 may be configured to store the basic programming and data constructs that provide the functionality of the present invention.

The various steps of the methods described herein may be encoded in computer instructions, such as software code modules, stored in a non-transitory computer memory. A processor of a computer system may execute the instructions in order to cause the computer system to perform the method. Software code modules and instructions that provide the functionality of the present invention may be stored, for example, in RAM 2470 and disk drive 2480. These software modules may be executed by processor(s) 2460. RAM 2470 and disk drive 2480 may also provide a repository for storing data used in accordance with the present invention.

RAM 2470 and disk drive 2480 may include a number of memories including a main random access memory (RAM) for storage of instructions and data during program execution and a read only memory (ROM) in which fixed non-transitory instructions are stored. RAM 2470 and disk drive 2480 may include a file storage subsystem providing persistent (non-volatile) storage for program and data files. RAM 2470 and disk drive 2480 may also include removable storage systems, such as removable flash memory.

Bus subsystem 2490 provides a mechanism for letting the various components and subsystems of computer 2420 communicate with each other as intended. Although bus subsystem 2490 is shown schematically as a single bus, alternative embodiments of the bus subsystem may utilize multiple busses.

FIG. 24 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The above embodiments of the present invention are illustrative and not limiting. Various alternatives and equivalents are possible. Although, the invention has been described with reference to a triple-patterning technology using three colors for validation by way of an example, it is understood that the invention is not limited by the triple-patterning technology but may also be applicable to higher than triple-patterning technologies such as technologies using more than three colors during validation. Although, the invention has been described with reference to an exemplary process for manufacturing certain integrated circuit transistor components by way of an example, it is understood that the invention is not limited by the type of process nor the type of transistor components so long as the process of components may benefit from the use of a triple-patterning or higher-patterning technology. In addition, the technique and system of the present invention is suitable for use with a wide variety of electronic design automation (EDA) tools and methodologies for designing, testing, and/or manufacturing systems characterized by a combination of conserved, signal flow, and event or digital system of equations. The scope of the invention should, therefore, be determined not with reference to the above description, but instead should be determined with reference to the pending claims along with their full scope or equivalents.

What is claimed is:

1. A computer-implemented method for validating an integrated circuit design, the method comprising:
   receiving, with the computer, the integrated circuit design, wherein the integrated circuit design is printable using a multiple-patterning process when the computer is invoked, wherein the integrated circuit design includes a plurality of shapes and at least one layout conflict preventing decomposition of the integrated circuit design into a plurality of multiple-patterning masks;
   forming a subset of the shapes, the subset including the shapes associated with the at least one layout conflict;
   categorizing each of the shapes of the subset into one of a plurality of topology types;
   generating one or more stitch candidate solutions for each of the plurality of topology types; and
   decomposing the design into a plurality of masks, wherein the subset of the plurality of shapes is formed by:
      generating, using the computer, a first graph representative of the integrated circuit design;
      decomposing, using the computer, the first graph into at least three colors to form a colored graph; and
      identifying a portion of the first graph, the portion forming a second graph including at least one color conflict edge preventing decomposition of the first graph into the at least three colors to form the subset of the plurality of shapes.

2. The computer-implemented method of claim 1 further comprising:
   selecting a stitch solution from the plurality of stitch candidate solutions according to a cost function.

3. The computer-implemented method of claim 2, wherein the cost function includes minimizing the number of the plurality of stitch candidate solutions.

4. The computer-implemented method of claim 2, wherein selecting a stitch solution comprises:
   decomposing the subset for each of the plurality of types into at least three colors.

5. The computer-implemented method of claim 1, wherein categorizing comprises:
   counting a number of loops and edges intersecting each vertex of a graph representing the subset of the plurality of shapes; and
   categorizing each vertex and corresponding shape in the subset into the plurality of types according to the number of loops and edges intersecting each vertex.

6. The computer-implemented method of claim 1, wherein generating the stitch candidate solutions comprises:
   forming keep out regions for each of the plurality of types; and
   generating a plurality of stitch candidate solutions for each of the plurality of types.

7. The computer-implemented method of claim 1, wherein the plurality of multiple-patterning masks includes at least three masks.

8. The computer-implemented method of claim 1, further comprising graphically displaying the stitch candidate solutions.

9. The computer-implemented method of claim 8, further comprising receiving a selection indicating a particular one of the stitch candidate solutions, and wherein the integrated circuit design is decomposed into a plurality of masks based on the indicated particular stitch candidate solution.

10. A system for validating an integrated circuit design configured to:
    receive the integrated circuit design, wherein the integrated circuit design is printable using a multiple-patterning process when a computer is invoked, wherein the integrated circuit design includes a plurality of shapes and at least one layout conflict preventing decomposition of the integrated circuit design into a plurality of multiple-patterning masks;
    form a subset of the shapes, the subset including the shapes associated with the at least one layout conflict;
    categorize each of the shapes of the subset into one of a plurality of topology types;
    generate one or more stitch candidate solutions for each of the plurality of topology types; and
    decompose the design into a plurality of masks, wherein to form the subset of the plurality of shapes the system is further configured to:
       generate a first graph representative of the integrated circuit design;
       decompose the first graph into at least three colors to form a colored graph; and
       identify a portion of the first graph, the portion forming a second graph including at least one color conflict edge preventing decomposition of the first graph into the at least three colors to form the subset of the plurality of shapes.

11. The system of claim 1 further configured to:
    select a stitch solution from the plurality of stitch candidate solutions according to a cost function.

12. The system of claim 11, wherein the cost function includes minimizing the number of the plurality of stitch candidate solutions.

13. The system of claim 11, wherein the system is further configured to:
    decompose the subset for each of the plurality of types into at least three colors.

14. The system of claim 1, wherein the system is further configured to:
    count a number of loops and edges intersecting each vertex of a graph representing the subset of the plurality of shapes; and categorize each vertex and corresponding shape in the subset into the plurality of types according to the number of loops and edges intersecting each vertex.

15. The system of claim 1, wherein the system is further configured to:
   form keep out regions for each of the plurality of types; and
   generate a plurality of stitch candidate solutions for each of the plurality of types.

16. The system of claim 1, wherein the plurality of multiple-patterning masks includes at least three masks.

17. The system of claim 1, further configured to graphically display the stitch candidate solutions.

18. The system of claim 17, further configured to receive a selection indicating a particular one of the stitch candidate solutions, and wherein the integrated circuit design is decomposed into a plurality of masks based on the indicated particular stitch candidate solution.

* * * * *